US011232953B2

(12) United States Patent
Fan et al.

(10) Patent No.: US 11,232,953 B2
(45) Date of Patent: Jan. 25, 2022

(54) METHOD OF MANUFACTURING A SEMICONDUCTOR DEVICE AND A SEMICONDUCTOR DEVICE

(71) Applicant: TAIWAN SEMICONDUCTOR MANUFACTURING CO., LTD., Hsinchu (TW)

(72) Inventors: Miao-Syuan Fan, Hsinchu (TW); Ching-Hua Lee, Hsinchu (TW); Ming-Te Chen, Hsinchu (TW); Jung-Wei Lee, Hsinchu (TW); Pei-Wei Lee, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/573,596

(22) Filed: Sep. 17, 2019

(65) Prior Publication Data

US 2021/0082707 A1    Mar. 18, 2021

(51) Int. Cl.
*H01L 21/285*      (2006.01)
*H01L 21/02*       (2006.01)
*H01L 29/66*       (2006.01)

(52) U.S. Cl.
CPC .. *H01L 21/28518* (2013.01); *H01L 21/02389* (2013.01); *H01L 21/02532* (2013.01); *H01L 21/02535* (2013.01); *H01L 21/02694* (2013.01); *H01L 29/665* (2013.01); *H01L 29/6656* (2013.01)

(58) Field of Classification Search
CPC ................................................ H01L 21/02694
See application file for complete search history.

(56) References Cited

U.S. PATENT DOCUMENTS

| 5,508,212 | A | 4/1996 | Wang et al. |
| 8,404,546 | B2 | 3/2013 | Woon et al. |
| 8,648,412 | B1 * | 2/2014 | Burke ............... H01L 29/66727 257/330 |
| 10,115,624 | B2 * | 10/2018 | Yu ..................... H01L 29/66795 |
| 10,163,786 | B2 | 12/2018 | Yang et al. |
| 10,475,702 | B2 | 11/2019 | Chen et al. |
| 2004/0180543 | A1 | 9/2004 | Lee et al. |

(Continued)

FOREIGN PATENT DOCUMENTS

| KR | 10-2004-0075556 A | 8/2004 |
| KR | 10-2009-0101831 A | 9/2009 |
| KR | 10-2019-0024536 A | 3/2019 |

OTHER PUBLICATIONS

Gwang-Sik Kim et al., "Effective Schottky Barrier Height Lowering of Metal/n-Ge with a TiO2/GeO2 Interlayer Stack," ACS Applied Material and Interfaces, 12 pgs., 2016.

(Continued)

*Primary Examiner* — Moin M Rahman
*Assistant Examiner* — Mohammad A Rahman
(74) *Attorney, Agent, or Firm* — McDermott Will & Emery LLP

(57) ABSTRACT

A semiconductor device includes a gate structure disposed over a channel region, a source/drain epitaxial layer disposed at a source/drain region, a nitrogen containing layer disposed on the source/drain epitaxial layer, a silicide layer disposed on the nitrogen containing layer, and a conductive contact disposed on the silicide layer.

19 Claims, 23 Drawing Sheets

(56) References Cited

U.S. PATENT DOCUMENTS

| | | | |
|---|---|---|---|
| 2007/0170588 A1* | 7/2007 | Goto | H01L 21/76885 |
| | | | 257/754 |
| 2009/0239344 A1 | 9/2009 | Jeong et al. | |
| 2017/0077248 A1* | 3/2017 | Eom | H01L 29/785 |
| 2017/0243760 A1* | 8/2017 | Chao | H01L 21/28518 |
| 2019/0067013 A1 | 2/2019 | Wang et al. | |
| 2019/0273147 A1* | 9/2019 | Cheng | H01L 21/76877 |

OTHER PUBLICATIONS

Lin-Lin Wang et al., "Effective Schottky Barrier Height Lowering by TiN Capping Layer for TiSix/Si Power Diode," IEEE Electron Device Letters, vol. 36, No. 6, pp. 597-599, Jun. 2015.

Gwang-Sik Kim et al., "Effective Schottky Barrier Height Lowering of Metal/n-Ge with a TO2/GeO2 Interlayer Stack," ACS Applied Material and Interfaces, vol. 8, pp. 35419-35425, 2016.

Atsushi Murakoshi et al., "Reduction in number of crystal defects in a p+Si diffusion layer by germanium and boron cryogenic implantation combined with sub-melt laser spike annealing," Japanese Journal of Applied Physics, vol. 56, 13 pgs., 2017.

Seunghyun Lee et al., "Statistical Study on the Schottky Barrier Reduction of Tunneling Contacts to CVD Synthesized MoS2," ACS Nano Letters, pp. 276-281, 2016.

Hao Yu et al., "Titanium Silicide on Si:P With Precontact Amorphization Implantation Treatment: Contact Resistivity Approaching 1×10-9 Ohm-cm2," IEEE Transactions on Electron Devices, vol. 63, No. 12, pp. 4632-4641, Dec. 2016.

* cited by examiner

METHOD OF MANUFACTURING A SEMICONDUCTOR DEVICE AND A SEMICONDUCTOR DEVICE

BACKGROUND

The disclosure relates to a semiconductor integrated circuit, and more particularly to a semiconductor device having an epitaxial source/drain (S/D) structure. As the semiconductor industry has progressed into nanometer technology process nodes in pursuit of higher performance, and lower costs, challenges from both fabrication and design issues have resulted in the development of three-dimensional designs, such as a fin field effect transistor (FinFET) and the use of a metal gate structure with a high-k (dielectric constant) material.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
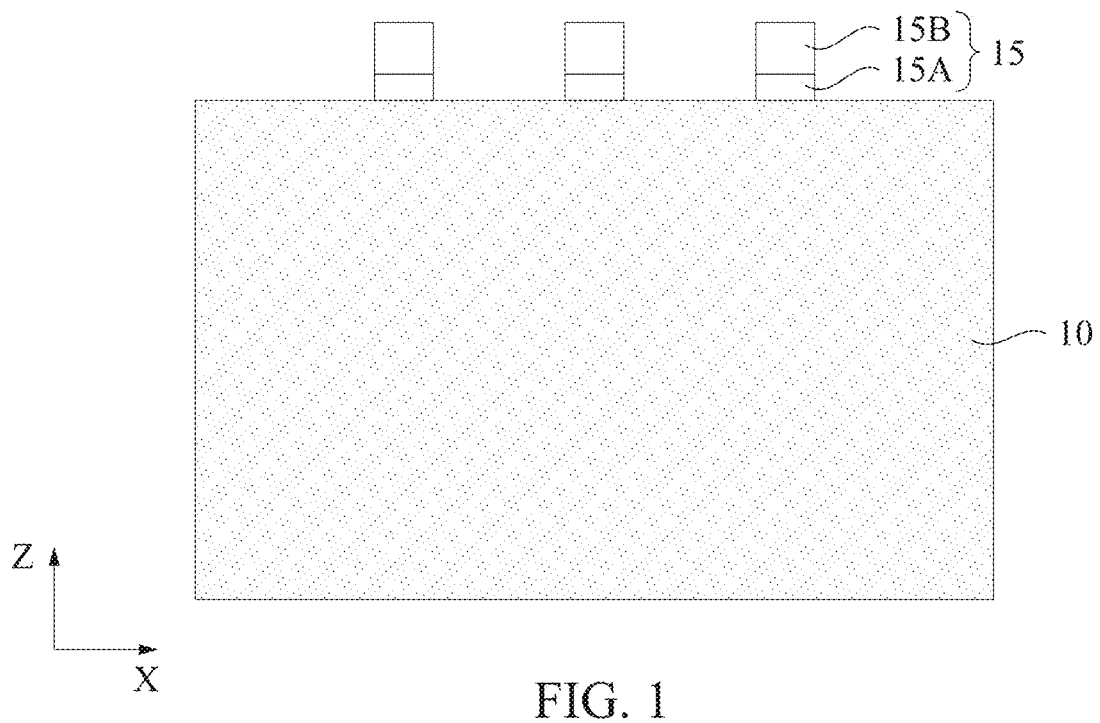
FIG. 1 shows a cross sectional view of one of the various stages of a manufacturing operation for a semiconductor device according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanied drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed. In the present disclosure, a phrase "one of A, B and C" means "A, B and/or C" (A, B, C, A and B, A and C, B and C, or A, B and C), and does not mean one element from A, one element from B and one element from C, unless otherwise described. Materials, configurations, dimensions, processes and/or operations same as or similar to those described with one embodiment may be employed in the other embodiments and the detailed explanation may be omitted.

Disclosed embodiments relate to a semiconductor device and its manufacturing method, in particular, source/drain contact regions structure with its vertical contact resistance reduction of a field effect transistor (FET). The embodiments such as those disclosed herein are generally applicable not only to FinFETs but also other FETs. For smaller three-dimensional structure, reducing contact resistance in smaller contact area is a great challenge. To lower Schottky barrier height (SBH), inserting an ultrathin interlayer between metal and semiconductor is a promising method to reduce contact resistance.

FIGS. 1-17 show cross sectional views of various stages for manufacturing a FinFET device according to an embodiment of the present disclosure. It is understood that additional operations can be provided before, during, and after processes shown by FIGS. 1-17, and some of the operations described below can be replaced or eliminated, for additional embodiments of the method. The order of the operations/processes may be interchangeable.

Fin structures for FinFETs can be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin structures. The multi-patterning processes combining photolithography and self-aligned processes generally result in forming a pair of fin structures.

In some embodiments, a mask layer 15 is formed over a substrate 10 to fabricate fin structures. The mask layer 15 is formed by, for example, a thermal oxidation process and/or a chemical vapor deposition (CVD) process. The substrate 10 is, for example, a p-type silicon or germanium substrate with an impurity concentration in a range from about $1\times10^{15}$ $cm^{-3}$ to about $1\times10^{16}$ $cm^{-3}$. In other embodiments, the substrate is an n-type silicon or germanium substrate with an impurity concentration in a range from about $1\times10^{15}$ $cm^{-3}$ to about $1\times10^{16}$ $cm^{-3}$.

Alternatively, the substrate 10 may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 10 is a silicon layer of an SOI (silicon-on insulator) substrate. When an SOI substrate is used, the fin structure may protrude from the silicon layer of the SOI substrate or may protrude from the insulator layer of the SOI substrate. In the latter case, the silicon layer of the SOI substrate is used to form the fin structure. Amorphous substrates, such as amorphous Si or amorphous SiC, or insulating material, such as silicon oxide may also be used as the substrate 10. The substrate 10 may include various regions that have been suitably doped with impurities (e.g., p-type or n-type conductivity).

The mask layer 15 includes, for example, a pad oxide (e.g., silicon oxide) layer 15A and a silicon nitride mask layer 15B in some embodiments. The pad oxide layer 15A may be formed by using thermal oxidation or a CVD process. The silicon nitride mask layer 15B may be formed by a physical vapor deposition (PVD), such as a sputtering method, a CVD, plasma-enhanced chemical vapor deposition (PECVD), an atmospheric pressure chemical vapor deposition (APCVD), a low-pressure CVD (LPCVD), a high density plasma CVD (HDPCVD), an atomic layer deposition (ALD), and/or other processes.

The thickness of the pad oxide layer 15A is in a range from about 2 nm to about 15 nm and the thickness of the silicon nitride mask layer 15B is in a range from about 2 nm to about 50 nm in some embodiments. A mask pattern is further formed over the mask layer. The mask pattern is, for example, a resist pattern formed by lithography operations.

By using the mask pattern as an etching mask, a hard mask pattern 15 of the pad oxide layer and the silicon nitride mask layer is formed, as shown in FIG. 1.

Figure 2:
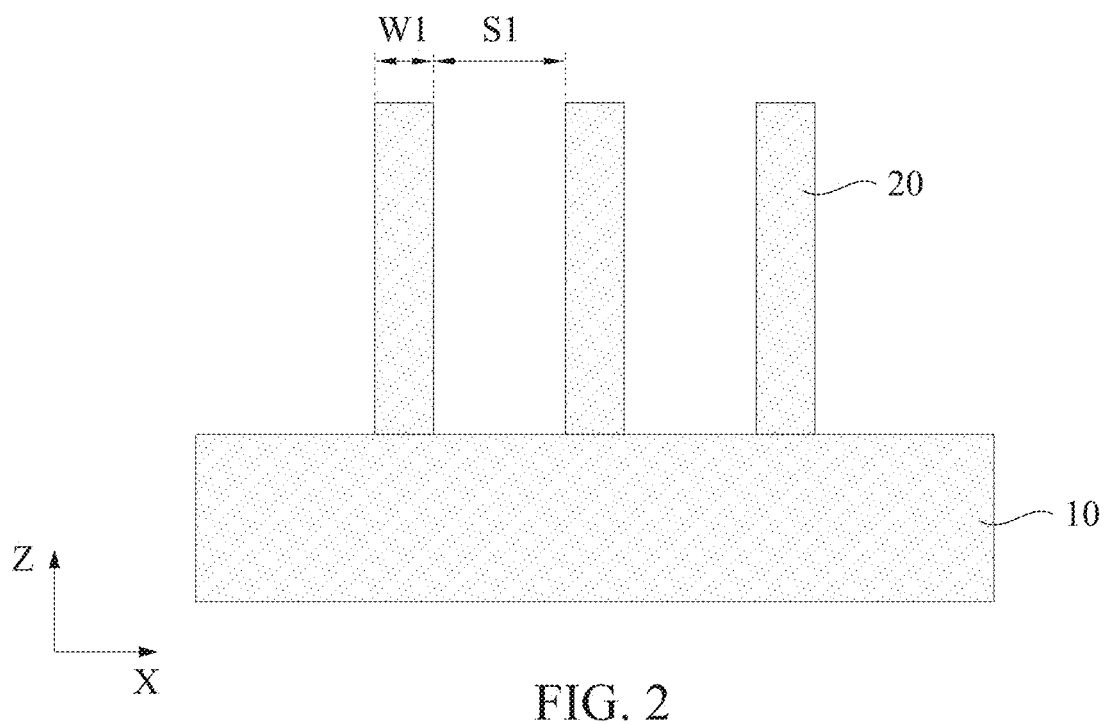
FIG. 2 shows a cross sectional view of one of the various stages of a manufacturing operation for a semiconductor device according to an embodiment of the present disclosure.

Then, as shown in FIG. 2, by using the hard mask pattern 15 as an etching mask, the substrate 10 is patterned into fin structures 20 by trench etching using a dry etching method and/or a wet etching method.

In FIG. 2, three fin structures 20 are disposed over the substrate 10. However, the number of the fin structures is not limited to three. The numbers may be as small as one or more than three. In some embodiments, the number of fin structures is in a range from 5 to 1000, which are connected by a source/drain epitaxial layer formed in subsequent operations. In other embodiments, the number of fin structures is in a range from 5 to 100, which are connected by a source/drain epitaxial layer formed in subsequent operations. In certain embodiments, the number of fin structures is in a range from 5 to 20, which are connected by a source/drain epitaxial layer formed in subsequent operations. In addition, one or more dummy fin structures may be disposed adjacent both sides of the fin structure 20 to improve pattern fidelity in patterning processes.

The fin structure 20 may be made of the same material as the substrate 10 and may continuously extend from the substrate 10. In this embodiment, the fin structure is made of Si. The silicon layer of the fin structure 20 may be intrinsic, or appropriately doped with an n-type impurity or a p-type impurity.

The width W1 of the fin structure 20 is in a range from about 5 nm to about 40 nm in some embodiments, and is in a range from about 7 nm to about 12 nm in other embodiments. The space S1 between two fin structures is in a range from about 10 nm to about 50 nm in some embodiments. The height (along the Z direction) of the fin structure 20 is in a range from about 100 nm to about 300 nm in some embodiments, and is in a range from about 50 nm to 100 nm in other embodiments.

The lower part of the fin structure 20 under the gate structure 40 (see, FIG. 5A) may be referred to as a well region, and the upper part of the fin structure 20 may be referred to as a channel region. Under the gate structure 40, the well region is embedded in the isolation insulating layer 30 (see, FIG. 5A), and the channel region protrudes from the isolation insulating layer 30. A lower part of the channel region may also be embedded in the isolation insulating layer 30 to a depth of about 1 nm to about 5 nm.

The height of the well region is in a range from about 60 nm to 100 nm in some embodiments, and the height of the channel region is in a range from about 40 nm to 60 nm, and is in a range from about 38 nm to about 55 nm in other embodiments.

Figure 3:
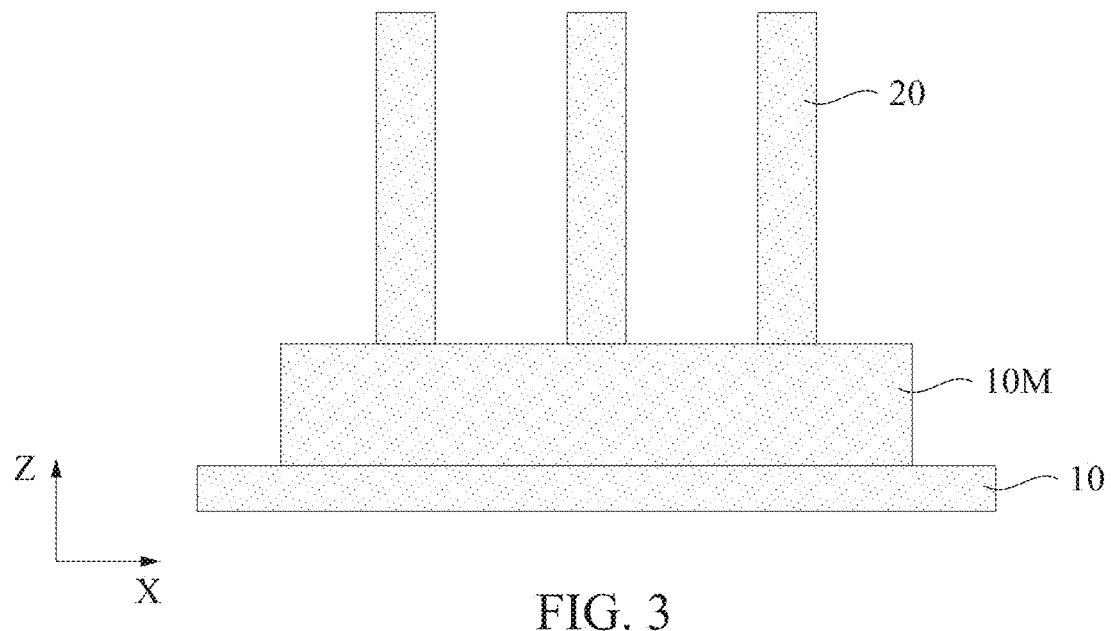
FIG. 3 shows a cross sectional view of one of the various stages of a manufacturing operation for a semiconductor device according to an embodiment of the present disclosure.

After the fin structures 20 are formed, the substrate 10 can be further etched to form a mesa shape 10M in some embodiments, as shown in FIG. 3. In other embodiments, the mesa shape 10M is first formed, and then the fin structures 20 are formed. In certain embodiments, no mesa shape is formed. In the following embodiments, the figures show embodiments in which no mesa structure is formed.

After the fin structures 20 (and optionally the mesa shape 10M) are formed, the isolation insulating layer 30 is formed in spaces between the fin structures and/or a space between one fin structure and another element formed over the substrate 10. The isolation insulating layer 30 may also be called a "shallow-trench-isolation (STI)" layer. The insulating material for the isolation insulating layer 30 may include one or more layers of silicon oxide, silicon nitride, silicon oxynitride (SiON), SiOCN, fluorine-doped silicate glass (FSG), or a low-k dielectric material. The isolation insulating layer is formed by LPCVD (low pressure chemical vapor deposition), plasma-CVD or flowable CVD. In the flowable CVD, flowable dielectric materials instead of silicon oxide may be deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. When the un-desired element(s) is removed, the flowable film densifies and shrinks. In some embodiments, multiple anneal processes are conducted. The flowable film is cured and annealed more than once. The flowable film may be doped with boron and/or phosphorous.

Figure 4:
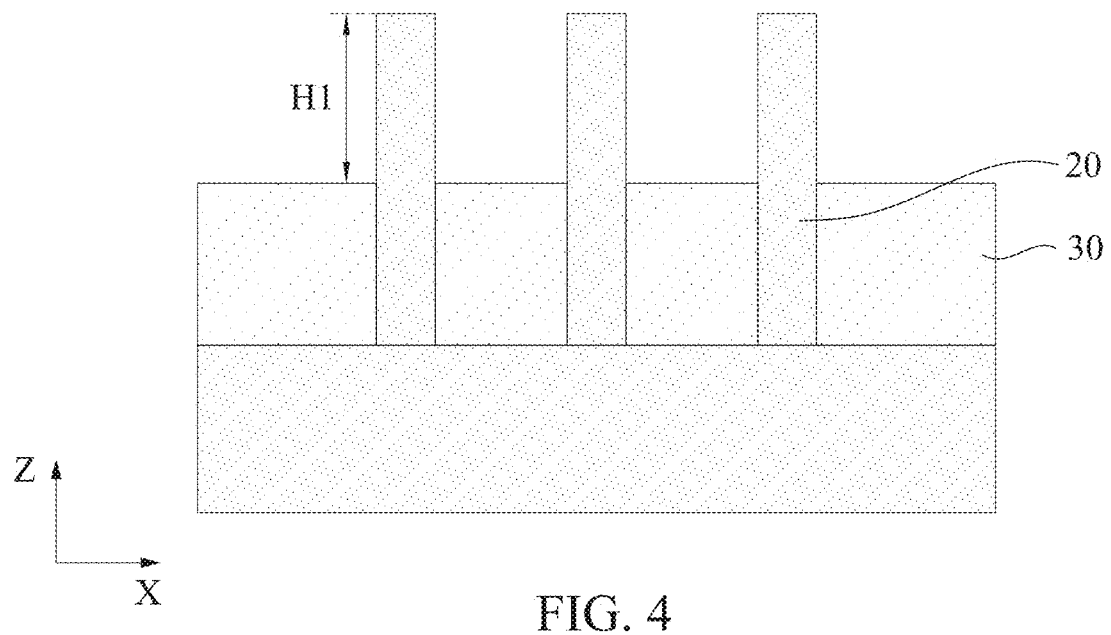
FIG. 4 shows a cross sectional view of one of the various stages of a manufacturing operation for a semiconductor device according to an embodiment of the present disclosure.

The insulating layer 30 is first formed in a thick layer so that the fin structures are embedded in the thick layer, and the thick layer is recessed so as to expose the upper portions of the fin structures 20, as shown in FIG. 4. The height H1 of the fin structures from the upper surface of the isolation insulating layer 30 is in a range from about 20 nm to about 100 nm in some embodiments, and is in a range from about 30 nm to about 50 nm in other embodiments. After or before recessing the isolation insulating layer 30, a thermal process, for example, an anneal process, may be performed to improve the quality of the isolation insulating layer 30. In certain embodiments, the thermal process is performed by using rapid thermal annealing (RTA) at a temperature in a range from about 900° C. to about 1050° C. for about 1.5 seconds to about 10 seconds in an inert gas ambient, such as an $N_2$, Ar or He ambient.

Figure 5A:
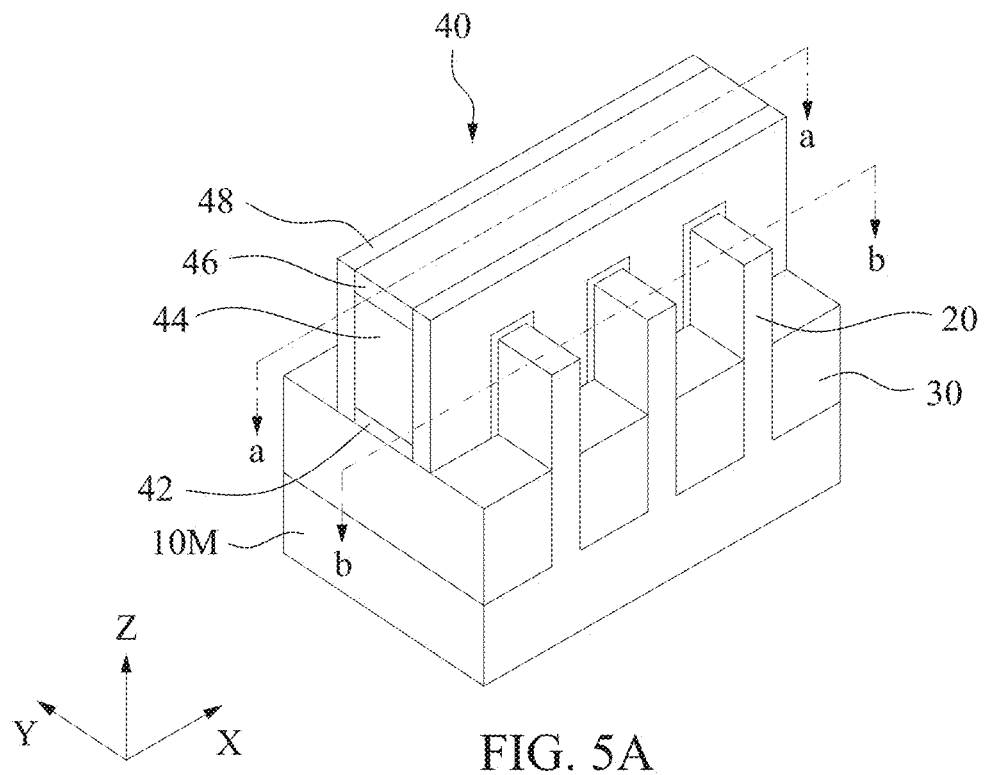
FIGS. 5A, 5B and 5C show views of one of the various stages of a manufacturing operation for a semiconductor device according to an embodiment of the present disclosure.
Figure 5B:
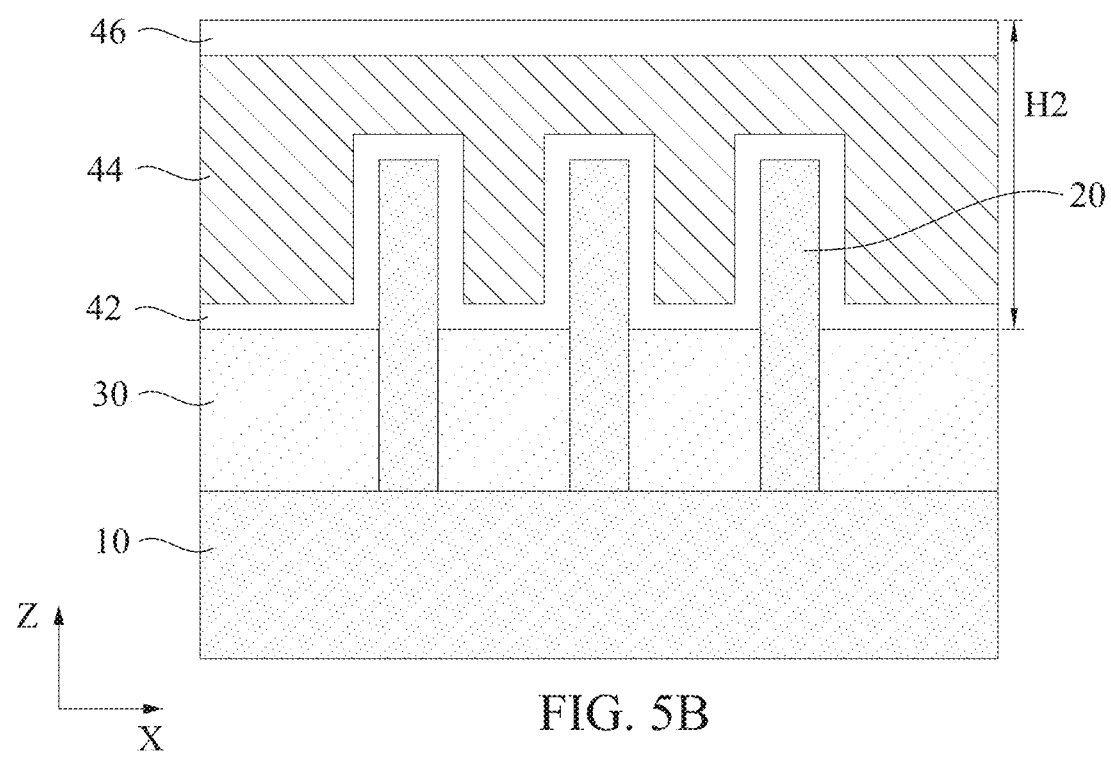
Figure 5C:
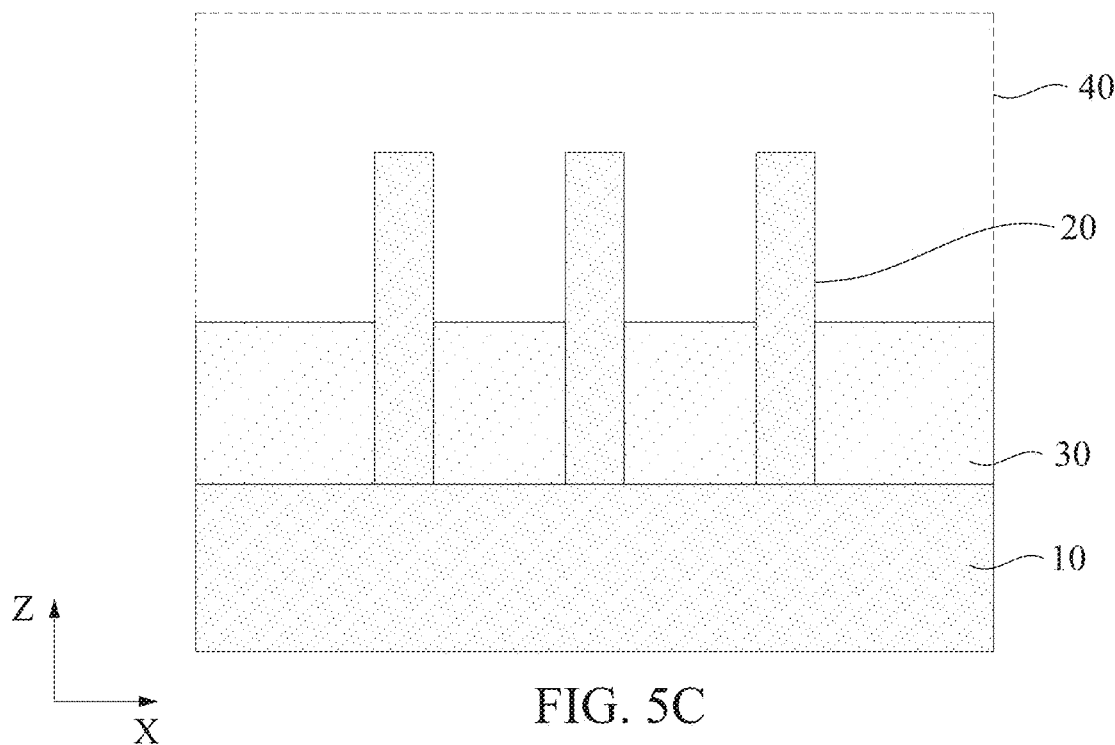

After the insulating layer 30 is formed, a gate structure 40 is formed over the fin structures 20, as shown in FIGS. 5A-5C. FIG. 5A is an exemplary perspective view, FIG. 5B is an exemplary cross sectional view along line a-a of FIG. 5A and FIG. 5C is an exemplary cross sectional view along line b-b of FIG. 5A. FIGS. 6-11 and 13-17 are also cross sectional views along line b-b of FIG. 5A.

As shown in FIG. 5A, the gate structure 40 extends in the X direction, while the fin structures 20 extend in the Y direction. To fabricate the gate structure 40, a dielectric layer and a poly silicon layer are formed over the isolation insulating layer 30 and the exposed fin structures 20, and then patterning operations are performed so as to obtain gate structures including a gate pattern 44 made of poly silicon and a dielectric layer 42. In some embodiments, the polysilicon layer is patterned by using a hard mask and the hard mask remains on the gate pattern 44 as a cap insulating layer 46. The hard mask (cap insulating layer 46) includes one or more layers of insulating material. The cap insulating layer 46 includes a silicon nitride layer formed over a silicon oxide layer in some embodiments. In other embodiments, the cap insulating layer 46 includes a silicon oxide layer formed over a silicon nitride layer. The insulating material for the cap insulating layer 46 may be formed by CVD, PVD, ALD, e-beam evaporation, or other suitable process. In some embodiments, the dielectric layer 42 includes one or more layers of silicon oxide, silicon nitride, silicon oxynitride, or high-k dielectrics. In some embodiments, a thickness of the dielectric layer 42 is in a range from about 2 nm to about 20 nm, and in a range from about 2 nm to about 10 nm in other embodiments. The height H2 of the gate structures is in a range from about 50 nm to about 400 nm in some embodiments, and is in a range from about 100 nm to 200 nm in other embodiments.

In some embodiments, a gate replacement technology is employed. In such a case, the gate pattern 44 and the dielectric layer 42 are a dummy gate electrode and a dummy gate dielectric layer, respectively, which are subsequently removed. If a gate-first technology is employed, the gate pattern 44 and the dielectric layer 42 are used as a gate electrode and a gate dielectric layer.

Further, gate sidewall spacers 48 are formed on both sidewalls of the gate pattern. The sidewall spacers 48 include one or more layers of insulating material, such as $SiO_2$, SiN, SiON, SiOCN or SiCN, which are formed by CVD, PVD, ALD, e-beam evaporation, or other suitable process. A low-k dielectric material may be used as the sidewall spacers. The sidewall spacers 48 are formed by forming a blanket layer of insulating material and performing anisotropic etching. In one embodiment, the sidewall spacer layers are made of silicon nitride based material, such as SiN, SiON, SiOCN or SiCN.

Figure 6:
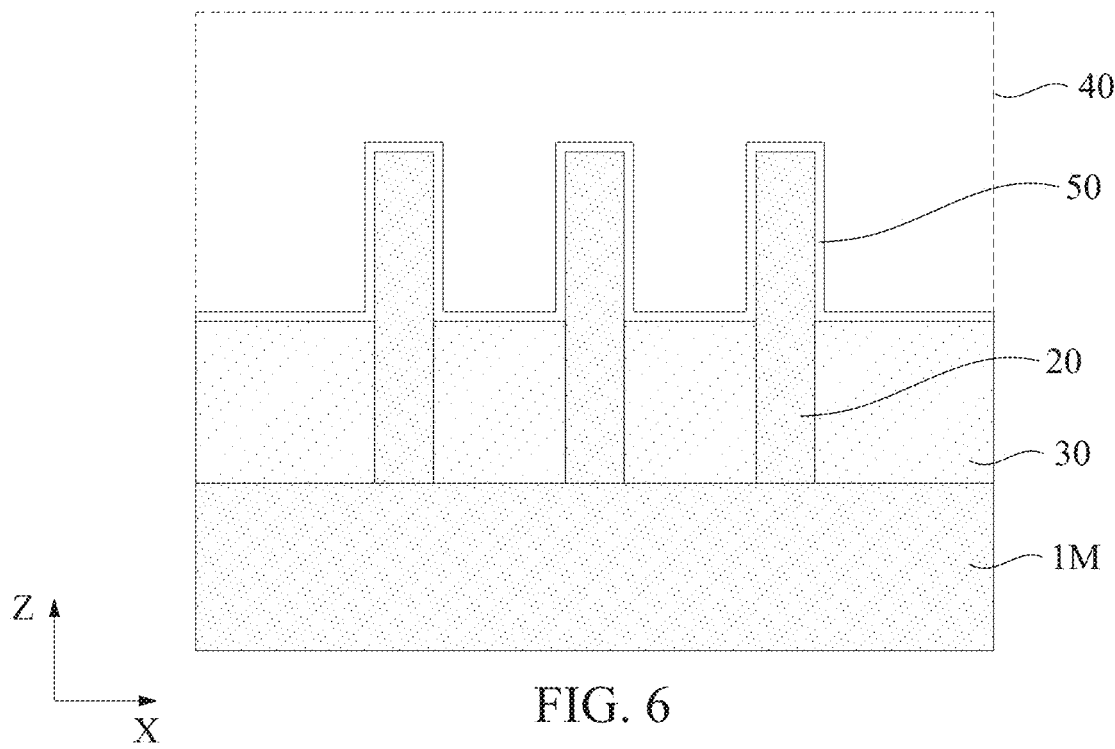
FIG. 6 shows a cross sectional view of one of the various stages of a manufacturing operation for a semiconductor device according to an embodiment of the present disclosure.

Then, as shown in FIG. 6, a fin liner layer 50 is formed over the fin structures 20. The fin liner layer 50 is made of dielectric material including silicon nitride based material, such as SiN, SiON, SiOCN or SiCN. In one embodiment, SiN is used as the fin liner layer 50. The fin liner layer 50 is formed by CVD, PVD, ALD, e-beam evaporation, or other suitable process. The thickness of the fin liner layer 50 is in a range from about 30 nm to about 70 nm in some embodiments.

In some embodiments, the fin liner layer 50 and the sidewall spacers 48 for the gate structure are separately formed. In other embodiments, the same blanket layer is used for the fin liner layer 50 and the sidewall spacers 48.

After forming the fin liner layer 50, the upper portion of the fin structures 20 are recessed and a part of the fin liner layer 50 disposed on side surfaces and the top surface of the fin structures protruding from the isolation insulating layer are removed by a dry etching and/or a wet etching operation. The upper portion of the fin structures 20 are recessed (etched) down to the level equal to or below the upper surface of the fin liner layer 50 on the upper surface isolation insulating layer 30, as shown in FIG. 7.

Figure 7:
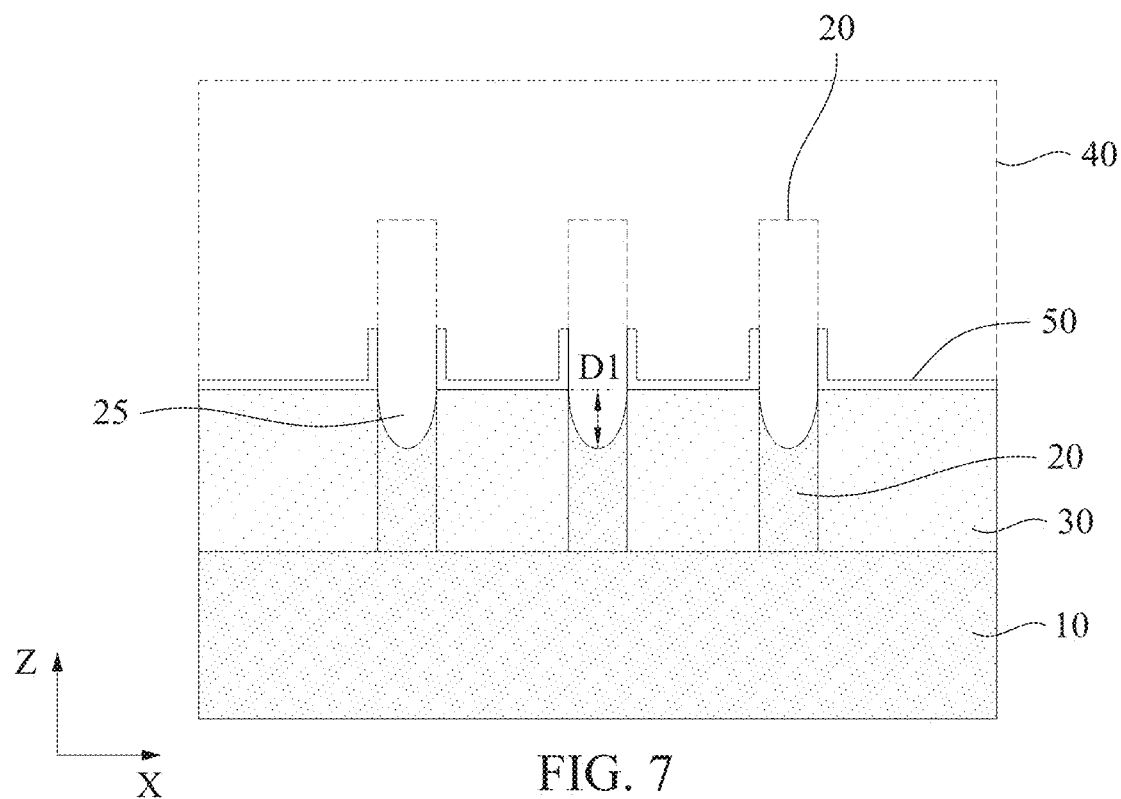
FIG. 7 shows a cross sectional views of one of the various stages of a manufacturing operation for a semiconductor device according to an embodiment of the present disclosure.

In some embodiments, a part of the fin liner layer 50 disposed on sidewalls of the fin structures remains after the fin recess etching, as shown in FIG. 7. In other embodiments, the fin liner layer 50 disposed on sidewalls of the fin structures is fully removed and the fin liner layer 50 remains only on the upper surface of the isolation insulating layer 30 after the fin recess etching.

In some embodiments, the top of the recessed fin structure 20 (the bottom of the recess 25) has a U-shape, semi-circular or bullet head shape (may be collectively referred to as a rounded corner shape), as shown in FIG. 7, which is a cross sectional view along the gate extension direction (X).

The fin structures 20 are recessed to form the rounded corner shape by using a pulsed-bias etching operation using a plasma etching apparatus. In some embodiments, the substrate 10 is placed on a wafer stage of an etching chamber, and the substrate 10 and/or the wafer stage is biased with, for example, DC voltage. RF power is applied to a counter electrode which is disposed above the substrate in some embodiments. In other embodiments, the RF power is applied via a coil surrounding the etching chamber. In some embodiments, the etching gas includes a halogen containing gas, such as HBr. In some embodiments, HBr is diluted with an inert gas, such as He and/or Ar. In some embodiments, a ratio of HBr to the dilution gas is in a range from about 0.3 to about 0.7, and in other embodiments, the ratio is in a range from about 0.4 to about 0.6.

In some embodiments, during an etching operation, the plasma chamber is maintained at a pressure in a range from about 1 mTorr to about 100 mTorr by a pumping system. In other embodiments, the pressure during the etching operation is in a range from about 3 mTorr to about 15 mTorr. The bias voltage is in a range from about 300 V to about 800 V in some embodiments, and is in a range from about 500 V to 600 V in other embodiments. The input RF power is in a range from about 300 W to about 800 W in some embodiments. The frequency of the RF is 13.56 MHz, 2.56 GHz or any other suitable frequencies used in the semiconductor industries.

In some embodiments, the bias voltage is pulsed voltage having a duty ratio (on-to-off ratio) in a range from about 10% to about 90%. In other embodiments, the duty ratio is in a range from about 30% to about 70%. In some embodiments, a unit cycle (one "on" period and one "off" period) is in a range from about 0.5 sec to 10 sec, and is in a range from about 1 sec to 5 sec. In some embodiments, the pulsed-bias etching is a repetition of etching and deposition operations. During the "on" period, the fin structures are etched and during the "off" period, the rate of deposition of by-products is greater than the etching rate. Thus, by adjusting the duty ratio, RF power and/or bias voltage, it is possible to form the rounded corner shape as shown in FIG. 7.

In some embodiments, by adjusting the etching conditions, for example, an over-etching time, a part of the fin liner layer 50 disposed on sidewalls of the fin structures remains, as shown in FIG. 7, or the fin liner layer 50 disposed on sidewalls of the fin structures is fully removed and the fin liner layer 50 remains only on the upper surface of the isolation insulating layer 30 remains after the fin recess etching.

Figure 8:
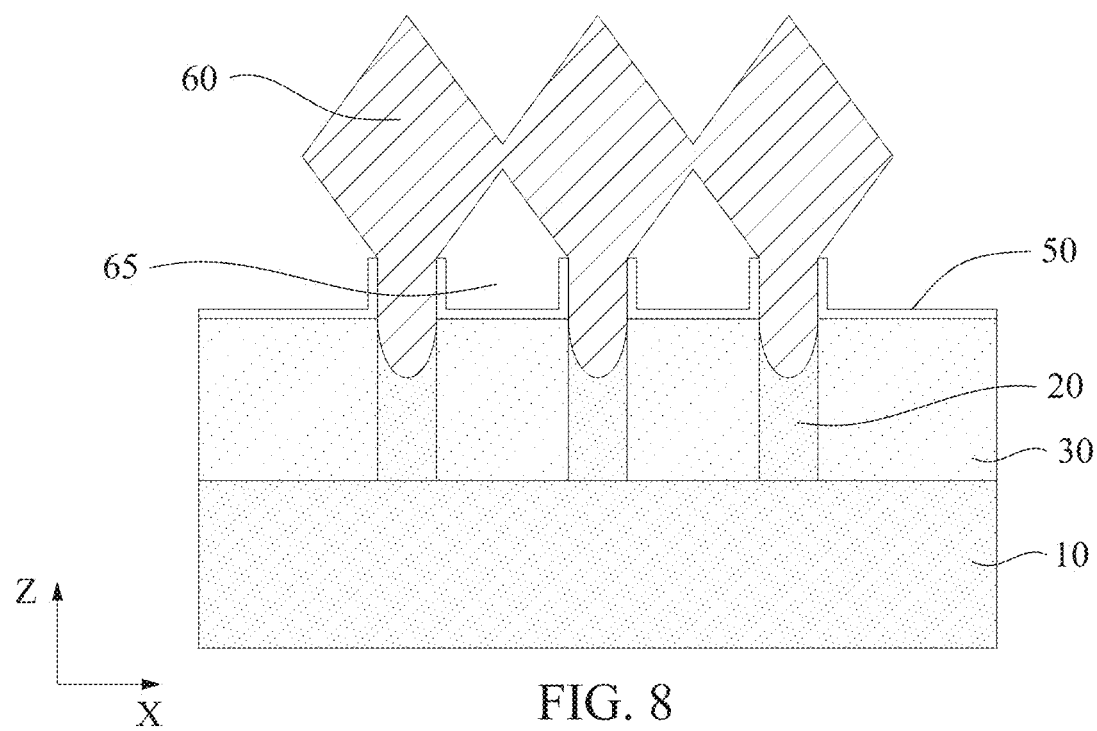
FIG. 8 shows a cross sectional view of one of the various stages of a manufacturing operation for a semiconductor device according to an embodiment of the present disclosure.

Then, as shown in FIG. 8, an epitaxial source/drain structure 60 is formed over the recessed fin structures 20. The epitaxial source/drain structure 60 is made of one or more layers of semiconductor material having a different lattice constant than the fin structures 20 (channel regions). When the fin structures are made of Si, the epitaxial source/drain structure 60 includes SiP, SiC or SiCP for an n-channel Fin FET and SiGe or Ge for a p-channel Fin FET. In certain embodiments, the source/drain epitaxial layer 60 is SiGe with a Ge amount in a range from about 20 atomic % to about 50 atomic %. The epitaxial source/drain structure 60 is epitaxially formed over the upper portions of the recessed fin structures. Due to the crystal orientation of the substrate formed into the fin structures 20 (e.g., (100) plane), the epitaxial source/drain structure 60 grows laterally and has a diamond-like shape.

The source/drain epitaxial layer 60 may be grown at a temperature of about 600 to 800° C. under a pressure of about 80 to 150 Torr, by using a Si containing gas, such as SiH$_4$, Si$_2$H$_6$ or SiCl$_2$H$_2$; a Ge containing gas, such as GeH$_4$, Ge$_2$H$_6$ or GeCl$_2$H$_2$; a C containing gas, such as CH$_4$ or C$_2$H$_6$; and/or a dopant gas, such as PH$_3$. The source/drain structure for an n-channel FET and the source/drain structure for a p-channel FET may be formed by separate epitaxial processes.

Due to the relatively small space between the fin structures and the fin liner layer 50 remaining on the upper surface of the isolation insulating layer between the fin structures and the rounded corner shape of the recessed fin structures 20, the adjacent epitaxial source/drain structures formed over each of the first fin structures 20 are merged such that a void or a gap (an air gap) 65 is formed by the merged second epitaxial source/drain structure 60 and the fin liner layer 50 on the upper surface of the isolation insulating layer 30, as shown in FIG. 8.

Figure 9:
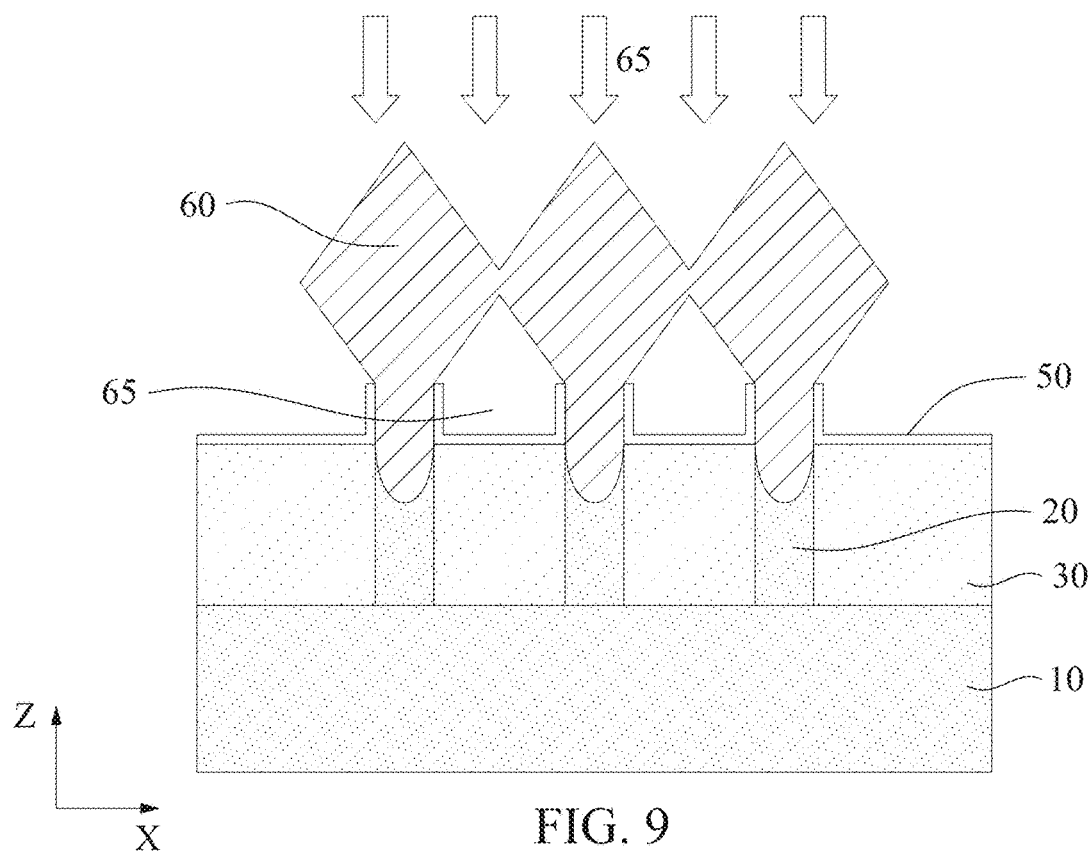
FIG. 9 shows a cross sectional view of one of the various stages of a manufacturing operation for a semiconductor device according to an embodiment of the present disclosure.

After the epitaxial source/drain structure 60 is formed, in some embodiments, a first ion implantation operation 65 is performed as pre-amorphization implantation (PAI) as shown in FIG. 9. The PAI is used to curtail channeling of the as-implanted boron which is subsequently implanted. The PAI can improve junction properties of source/drain junctions. In some embodiments, Ge is implanted to a PMOS device. In some embodiments, a Ge containing layer is formed by a deposition method at the surface of the epitaxial source/drain structure 60.

Figure 10:
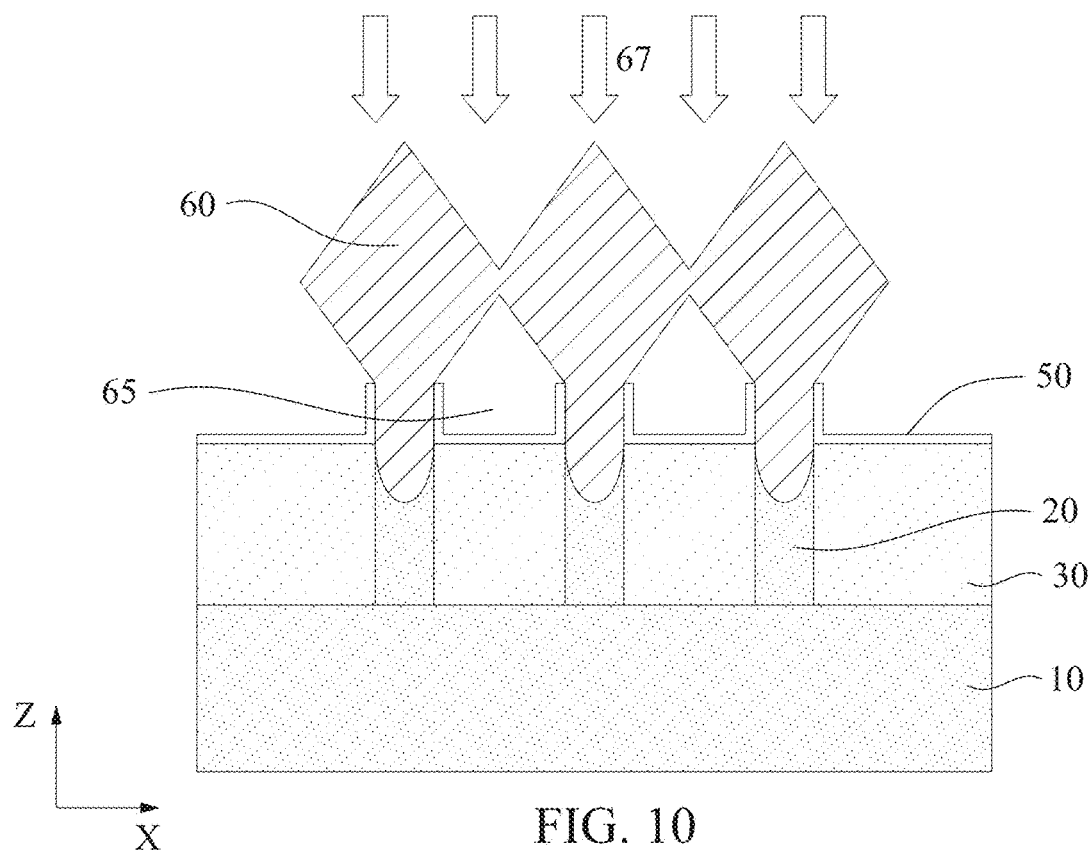
FIG. 10 shows a cross sectional view of one of the various stages of a manufacturing operation for a semiconductor device according to an embodiment of the present disclosure.

Further, as shown in FIG. 10, a second ion implantation operation 67 is performed after the first PAI. In the second ion implantation, B is implanted at energies of about 250 eV to 5 keV and at a dose of about $5 \times 10^{14}$ cm$^{-2}$ to about $5 \times 10^{15}$ cm$^{-2}$ for a PMOS, in some embodiments. For an NMOS, no PAI is performed and in the second ion implantation, P and/or As are implanted at energies of about 250 eV to 5 keV and at a dose of about $5 \times 10^{14}$ cm$^{-2}$ to about $5 \times 10^{15}$ cm$^{-2}$, in some embodiments.

After the second ion implantation, an annealing operation is performed. In some embodiments, the temperature of the annealing operation is in a range from about 500° C. to about 750° C.

Figure 11:
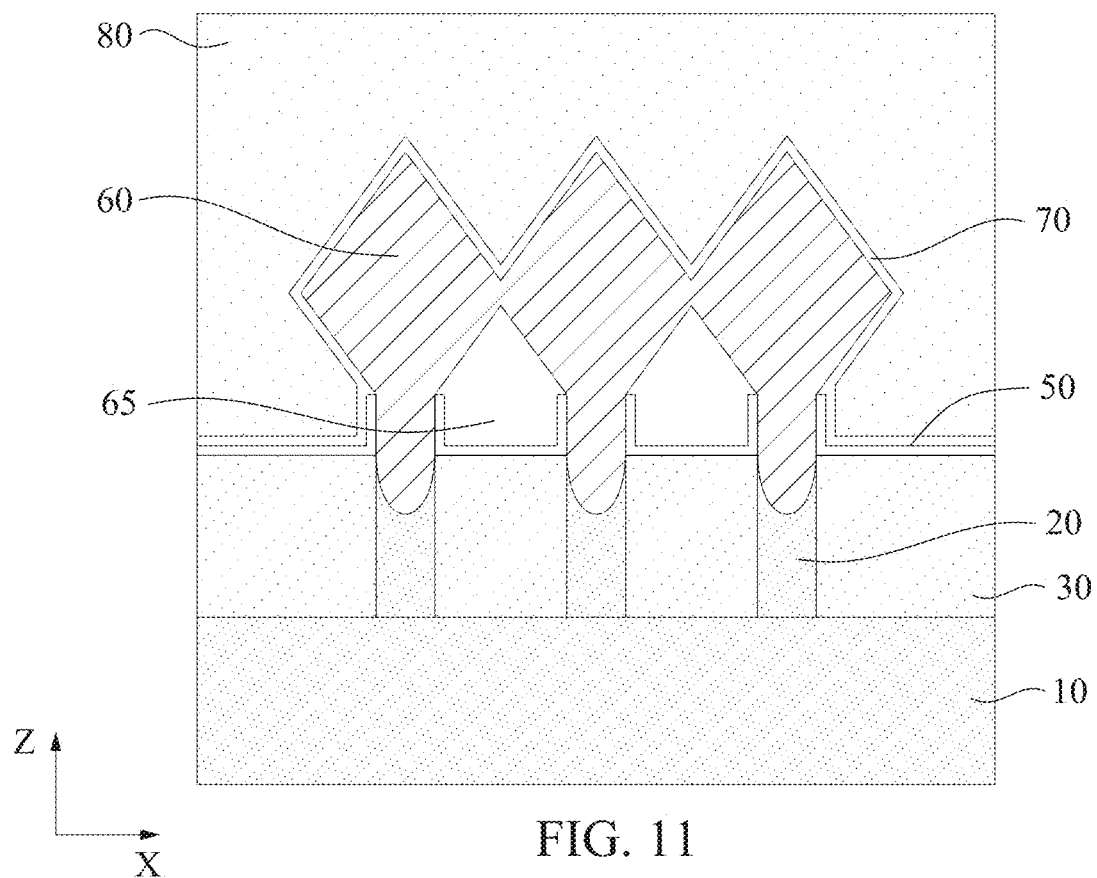
FIG. 11 shows a cross sectional view of one of the various stages of a manufacturing operation for a semiconductor device according to an embodiment of the present disclosure.

In some embodiments, as shown in FIG. 11, an insulating layer 70, functioning as a contact etching stop layer, is formed over the source/drain epitaxial layer 60, and then one or more interlayer dielectric (ILD) layers 80 is formed. The insulating layer 70 is one or more layers of insulating material. In one embodiment, the insulating layer 70 is made of silicon nitride formed by CVD. The materials for the ILD layer 80 include compounds comprising Si, O, C and/or H, such as silicon oxide, SiCOH and SiOC. Organic materials, such as polymers, may be used for the interlayer dielectric layer 80.

Figure 12:
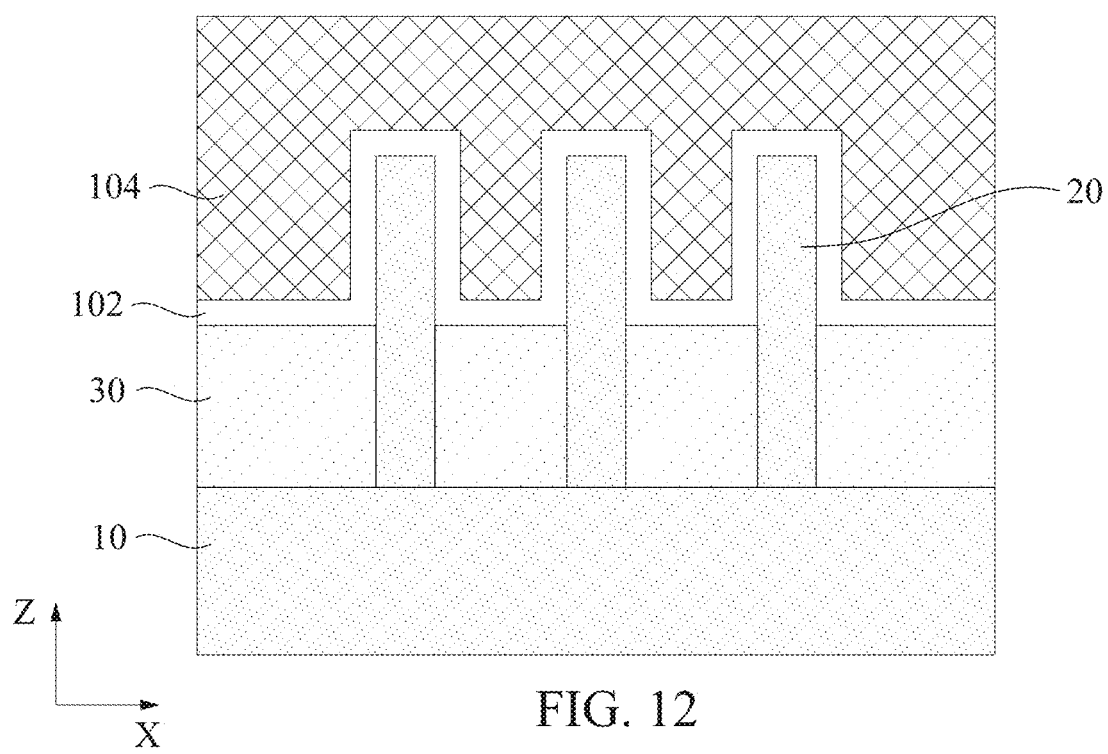
FIG. 12 shows a cross sectional view of one of the various stages of a manufacturing operation for a semiconductor device according to an embodiment of the present disclosure.

After the ILD layer 80 is formed, a planarization operation, such as a CMP operation, is performed to expose the gate pattern 44 (a dummy gate electrode). The dummy gate electrode 44 and the dummy gate dielectric layer 42 are removed, by appropriate etching processes, respectively, to form a gate opening. Metal gate structures including a gate dielectric layer 102 and metal gate electrode 104 are formed in the gate openings as shown in FIG. 12, which is a cross sectional view corresponding to line a-a of FIG. 5A.

The gate dielectric layer 102 is formed over an interface layer (not shown) disposed over the channel layer of the fin structures 20 in some embodiments. The interface layer may include silicon oxide or germanium oxide with a thickness of 0.2 nm to 1.5 nm in some embodiments. In other embodiments, the thickness of the interface layer is in a range about 0.5 nm to about 1.0 nm.

The gate dielectric layer 102 includes one or more layers of dielectric materials, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The gate dielectric layer is formed by, for example, chemical vapor deposition (CVD), physical vapor deposition (PVD), atomic layer deposition (ALD), high density plasma CVD (HDPCVD), or other suitable methods, and/or combinations thereof. The thickness of the gate dielectric layer is in a range from about 1 nm to about 10 nm in some embodiments, and may be in a range from about 2 nm to about 7 nm in other embodiments.

The metal gate electrode 104 is formed over the gate dielectric layer. The metal gate electrode 104 includes one or more layers of any suitable metal material, such as aluminum, copper, titanium, tantalum, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

In certain embodiments of the present disclosure, one or more work function adjustment layers (not shown) are interposed between the gate dielectric layer and the metal gate electrode. The work function adjustment layer is made of a conductive material such as a single layer of TiN, TaN, TaAlC, TiC, TaC, Co, Al, TiAl, HfTi, TiSi, TaSi or TiAlC, or a multilayer of two or more of these materials. For the n-channel Fin FET, one or more of TaN, TaAlC, TiN, TiC, Co, TiAl, HfTi, TiSi and TaSi is used as the work function adjustment layer, and for the p-channel Fin FET, one or more of TiAlC, Al, TiAl, TaN, TaAlC, TiN, TiC and Co is used as the work function adjustment layer.

After depositing appropriate materials for the metal gate structures, planarization operations, such as CMP, are performed.

After the metal gate electrode is formed, additional one or more ILD layers are formed over the ILD layer 80. In FIGS. 13-17, the ILD layer 80 and the additional ILD layer are collectively referred to as an ILD layer 81.

Figure 13:
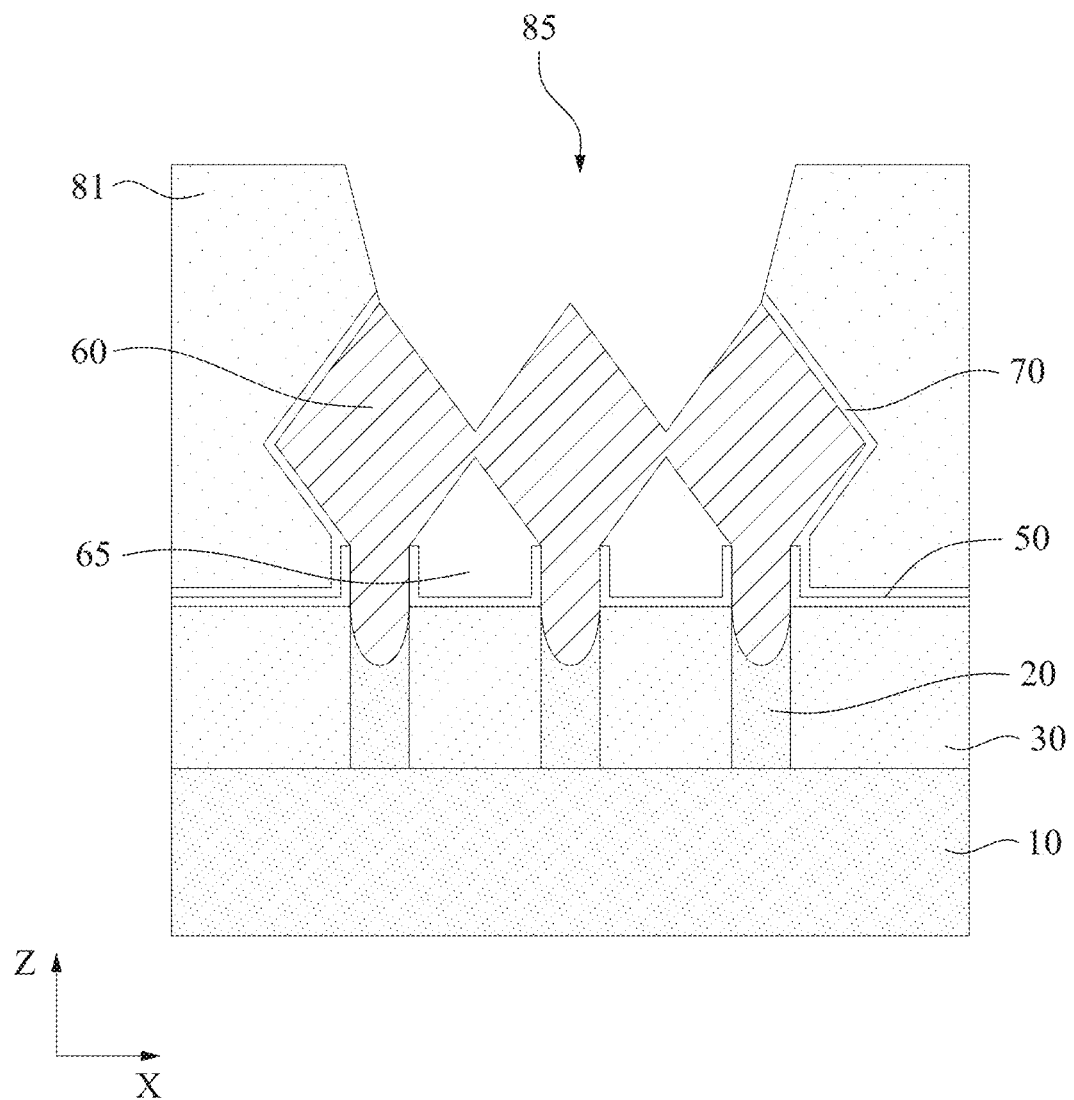
FIG. 13 shows a cross sectional view of one of the various stages of a manufacturing operation for a semiconductor device according to an embodiment of the present disclosure.

As shown in FIG. 13, a contact opening 85 is formed over the source/drain epitaxial layer 60 by using one or more lithography and etching operations, to expose at least a part of the upper surface of the source/drain epitaxial layer 60.

In some embodiments, the first and second ion implantation operations and subsequent annealing operation explained with respect to FIGS. 9 and 10 are performed after the contact opening 85 is formed.

Figure 14:
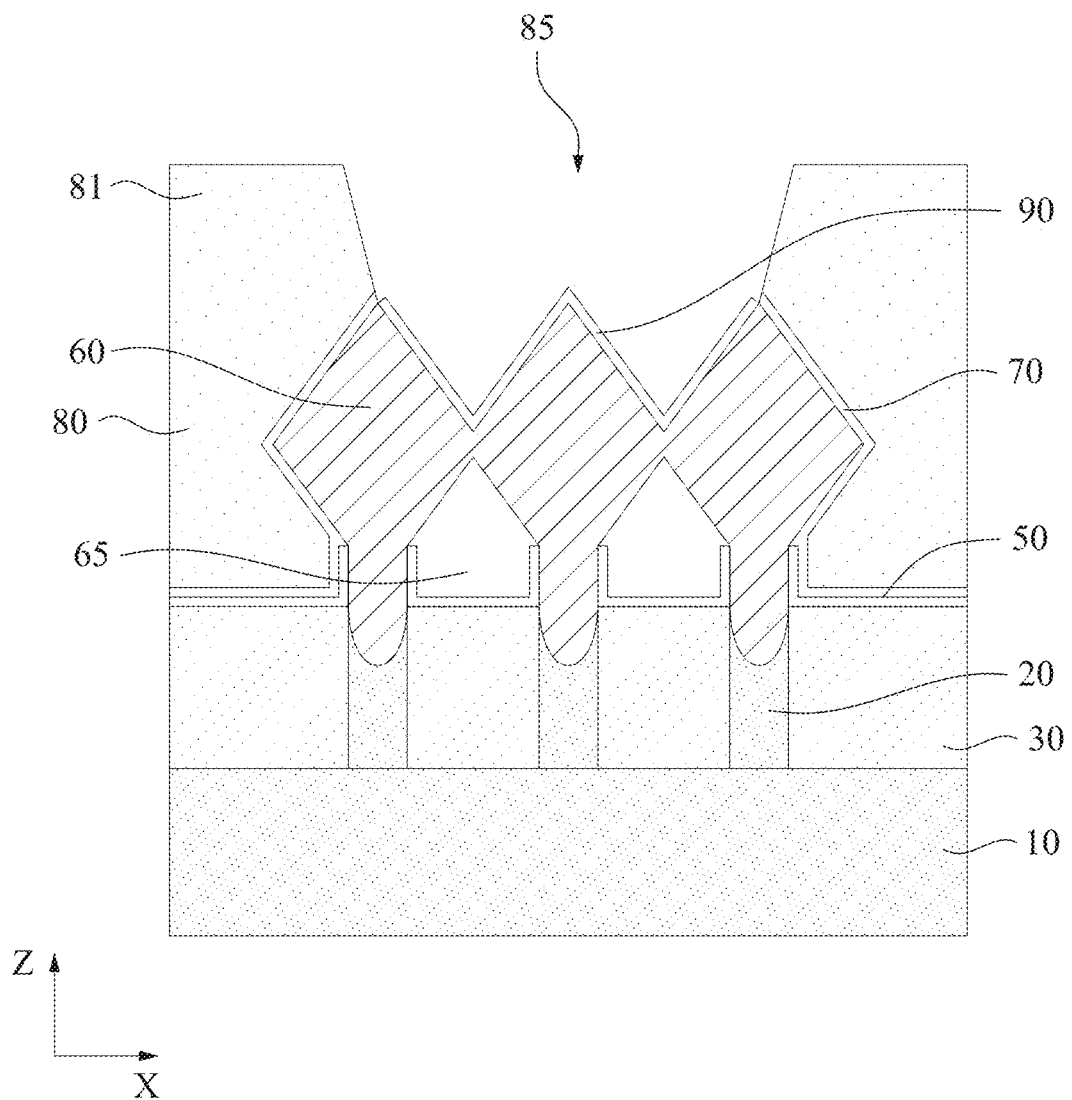
FIG. 14 shows a cross sectional view of one of the various stages of a manufacturing operation for a semiconductor device according to an embodiment of the present disclosure.

After the contact opening 85 is formed, a nitrogen containing layer 90 is formed by a nitrogen treatment at the surface of the exposed source/drain epitaxial layer 60 as shown in FIG. 14.

In some embodiments, the nitrogen containing layer 90 is formed by exposing the surface of the epitaxial source/drain layer 60 to plasma formed from a nitrogen containing gas. In some embodiments, the nitrogen containing gas is $N_2$ and/or $NH_3$. An inert gas, such as Ar, He and/or Ne is also added to the nitrogen containing gas in some embodiments. In certain embodiments, a mixed gas of $N_2$ and Ar is used to generate the plasma. In some embodiments, during the plasma treatment and/or after the plasma treatment, the substrate 10 is heated at 450° C. or higher. In some embodiments, the substrate 10 is heated at a temperature in a range from about 450° C. to about 600° C. The temperature is in a range from about 475° C. to about 550° C. in other embodiments.

In other embodiments, the nitrogen containing layer 90 is formed by exposing the surface of the epitaxial source/drain layer 60 to an $NH_3$ gas while heating the substrate 10 at 450° C. or higher. In some embodiments, the substrate 10 is heated at a temperature in a range from about 450° C. to about 600° C. The temperature is in a range from about 475° C. to about 550° C. in other embodiments.

In some embodiments, the nitrogen containing layer 90 is formed at a temperature lower than, for example, 450° C., and an annealing operation at a temperature in a range from about 450° C. to about 600° C. is performed. The temperature is in a range from about 475° C. to about 550° C. in other embodiments.

Figure 25:
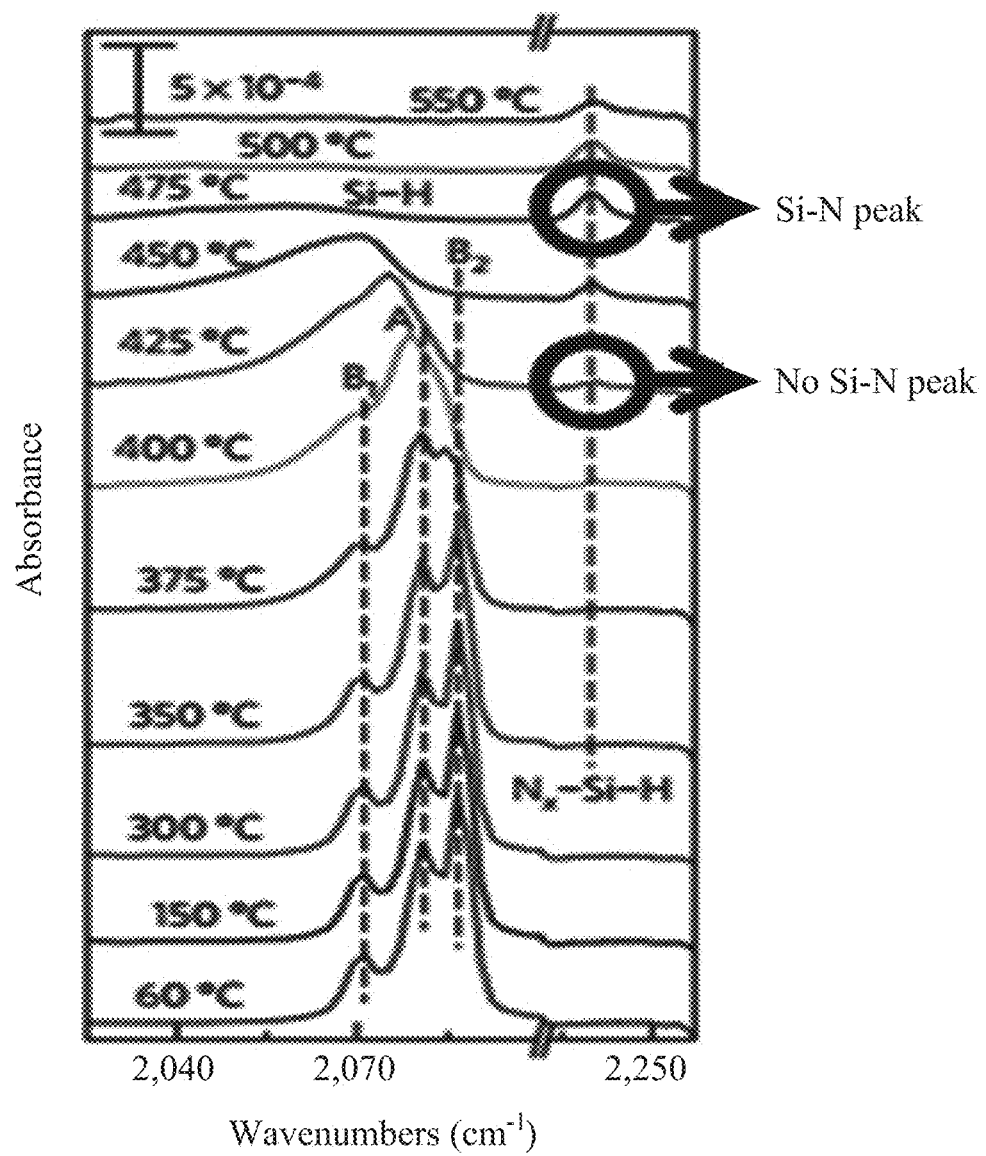
FIG. 25 show measurement results of Fourier Transform infrared spectrometer (FTIR) on various samples according to embodiments of the present disclosure.

FIG. 25 show measurement results of Fourier Transform infrared spectrometer (FTIR) on various samples after the nitrogen treatment. When the temperature is less than 450° C., substantially no peak corresponding to a Si—N bond was observed. In contrast, when the temperature is more than 450° C., more specifically, 475° C., a peak corresponding to a Si—N bond was observed, which indicates high film quality of the nitrogen containing layer 90 and/or the source/drain epitaxial layer 60. The formation of Si—N bonds is also beneficial to reduce a Schottly barrier height between the source/drain epitaxial layer 60 and a subsequently formed metal contact 100.

Figure 15:
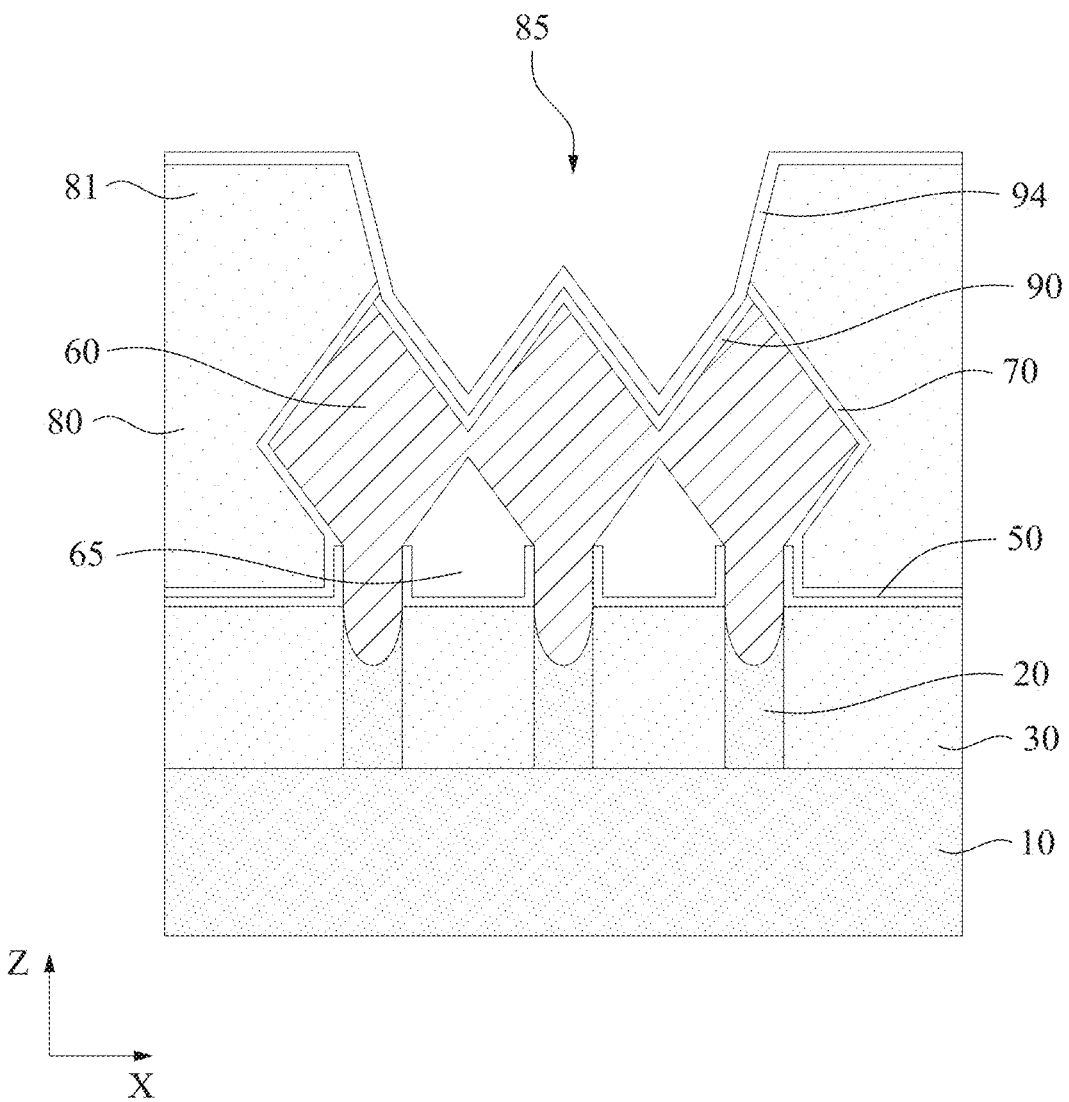
FIG. 15 shows a cross sectional view of one of the various stages of a manufacturing operation for a semiconductor device according to an embodiment of the present disclosure.
Figure 16:
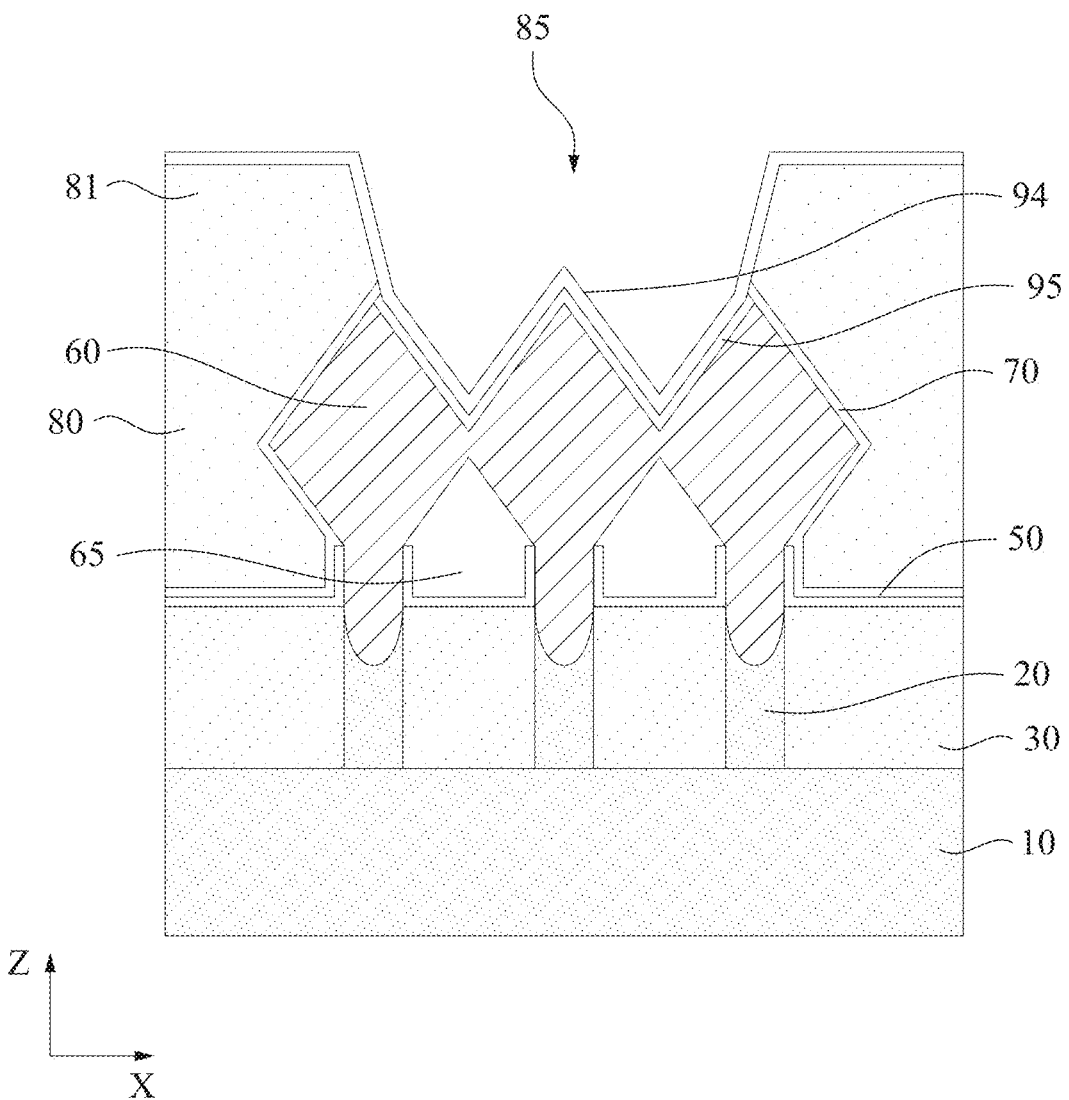
FIG. 16 shows a cross sectional view of one of the various stages of a manufacturing operation for a semiconductor device according to an embodiment of the present disclosure.

After the nitrogen containing layer 90 is formed, a metal layer 94 is formed as shown in FIG. 15. The metal layer 94 can be formed by CVD, ALD, PVD or any other suitable film formation methods. In some embodiments, the metal layer 94 is a layer of Ni, Ti, Ta and/or W. In certain embodiments, Ti is used as the metal layer 94. After the metal layer 94 is formed, an annealing operation is performed to from an alloy layer 95 of the metal element of the metal layer 94 and an element (e.g., Si or Si and Ge) of the source/drain epitaxial layer 60, as shown in FIG. 16.

The annealing operation is performed at a temperature of about 250° C. to about 850° C. in some embodiments. The thickness of the alloy layer 95 is in a range from about 4 nm to about 10 nm in some embodiments. Before or after the annealing operations, the metal material 94 formed over the isolation insulating layer 30 is selectively removed.

In some embodiments, the alloy layer 95 is a silicide layer. In some embodiments, the alloy layer 95 is a TiSi layer. In certain embodiments, the alloy layer is a TiSi layer containing nitrogen. In other embodiments, the alloy layer 95 is a TiSi layer containing Ge. In certain embodiments, the alloy layer is a TiSi layer containing Ge and N. In some embodiments, the semiconductor device is a p-type MOSFET. In other embodiments, the semiconductor device is an n-type MOSFET. According to the types of MOSFETs, appropriate materials are selected.

After the alloy layer 95 is formed, a part of the nitrogen containing layer 90 remains in some embodiments. In other embodiments, all the nitrogen containing layer 90 (nitrogen containing semiconductor (Si, SiGe layer) is consumed to form the alloy layer 95.

In some embodiments, all the metal (e.g., Ti) layer formed on the nitrogen containing layer 90 is consumed to form the alloy layer 95, and a part of the metal layer on the ILD layer 81 remains. In other embodiments, after the alloy layer 95 is formed, a part of the metal layer 94 formed on the nitrogen containing layer 90 remains. The remaining metal layer 94 is removed in some embodiments, and is not removed in other embodiments.

Figure 17:
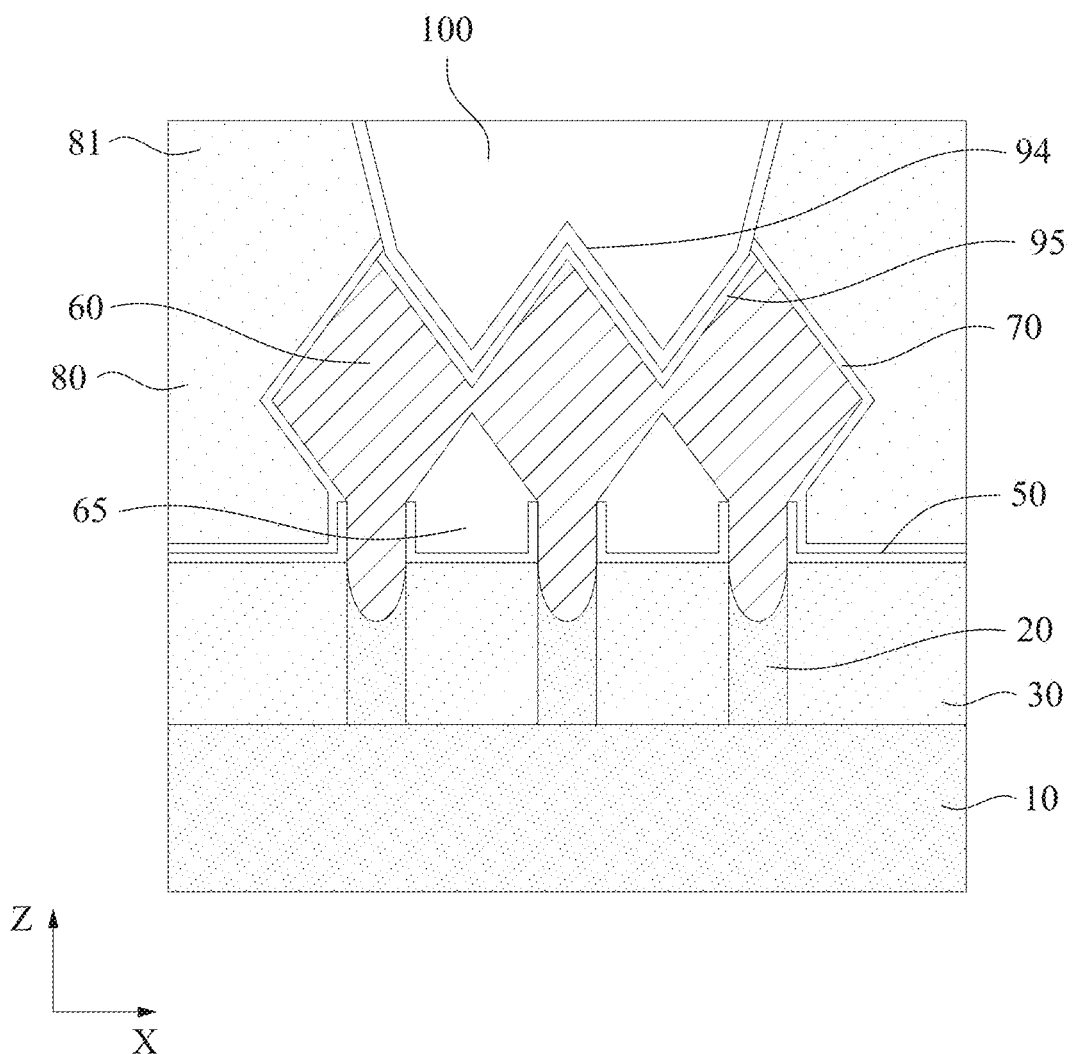
FIG. 17 shows a cross sectional view of one of the various stages of a manufacturing operation for a semiconductor device according to an embodiment of the present disclosure.

Then, the contact opening 85 is filled with a conductive material, thereby forming a metal contact 100 (contact plug), as shown in FIG. 17. After the conductive material is formed on the remaining metal layer 94, a CMP operation is performed to remove the conductive material and metal layer formed over the upper surface of the ILD layer 81 are removed. The metal contact 100 may include a single layer or multiple layers of any suitable metal such as Co, W, Ti, Ta, Cu, Al and/or Ni and/or nitride thereof.

After forming the metal contact, further CMOS processes are performed to form various features such as additional interlayer dielectric layer, contacts/vias, interconnect metal layers, and passivation layers, etc.

In some embodiments, the nitrogen containing layer 90 is formed before the ILD layer 80 is formed, and the alloy layer 95 is formed after the contact opening 85 is formed in the ILD layer 81. In such a case, the nitrogen containing layer 90 is formed on the entire exterior surface of the source/drain epitaxial layer 60. In other embodiments, the nitrogen containing layer 90 and the alloy layer 95 are formed before the ILD layer 80 is formed. In such a case, a wrap-around contact, which covers the entire exterior surface of the source/drain epitaxial layer 60 can be formed in some embodiments.

In some embodiments, the metal gate structure is formed after the source/drain epitaxial layer 60 is formed and before the silicide layer 85 is formed. In other embodiments, the metal gate structure is formed before the source/drain epitaxial layer is formed.

Figure 18:
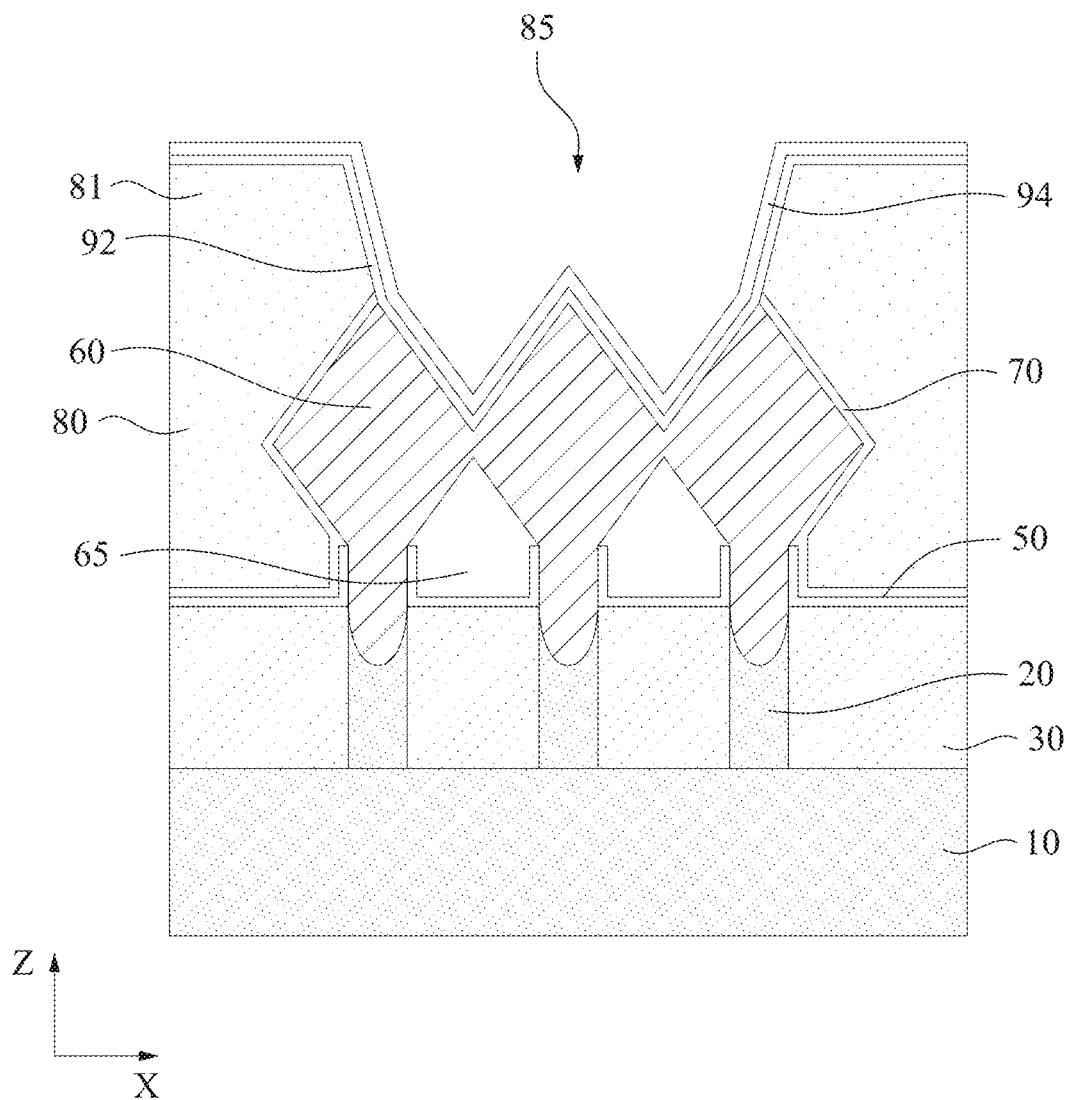
FIGS. 18 and 19 show cross sectional views of the various stages of a manufacturing operation for a semiconductor device according to an embodiment of the present disclosure.
Figure 19:
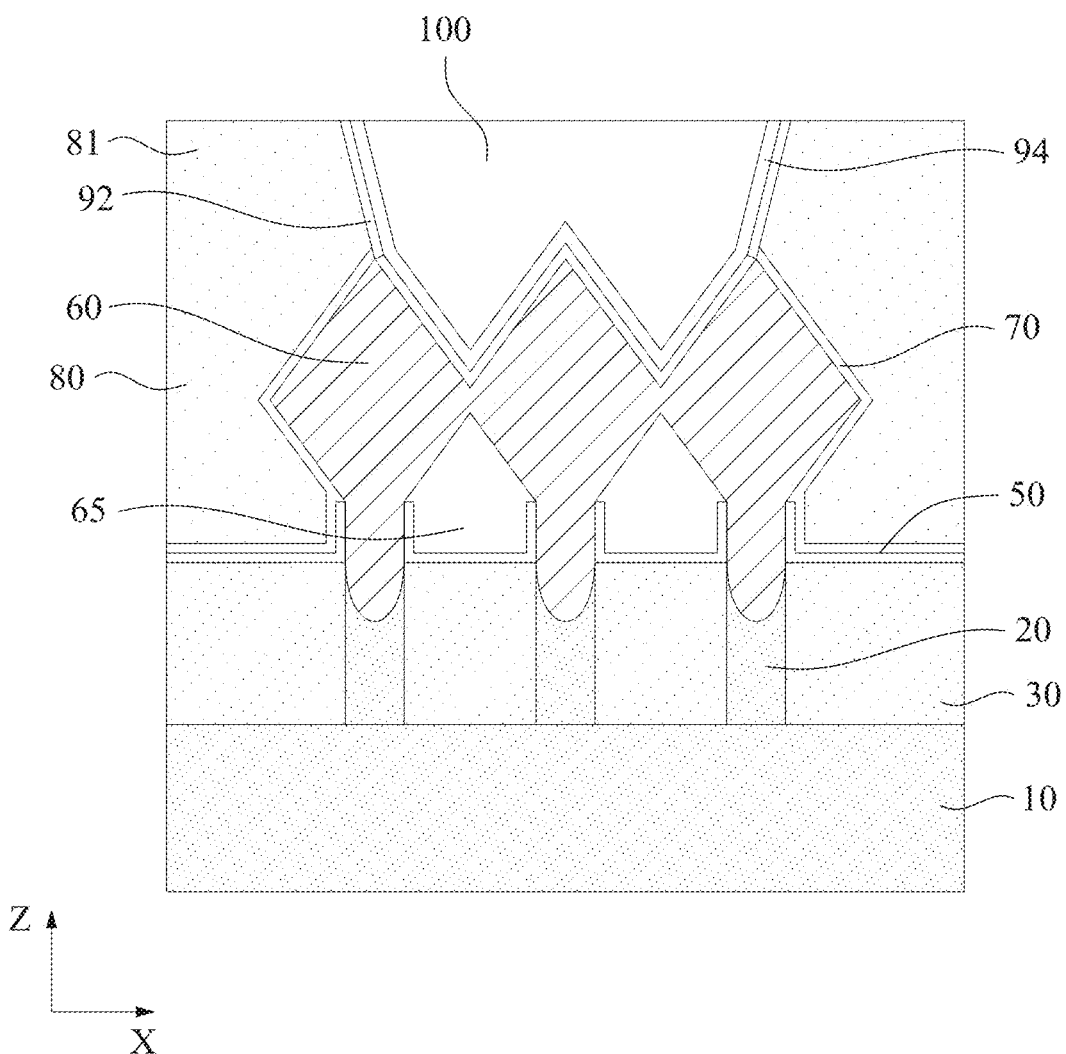

FIGS. 18 and 19 show exemplary cross sectional views of various stages for manufacturing a Fin FET device according to another embodiment of the present disclosure. Materials, configurations, dimensions, processes and/or operations same as or similar to those described with the foregoing embodiments may be employed in the following embodiments and the detailed explanation may be omitted.

After the contact opening 85 is formed as shown in FIG. 13, a metal nitride layer 92 is formed in the contact opening 85 and a metal layer 94 is formed over the metal nitride layer 92 as shown in FIG. 18. The metal nitride layer 92 and the metal layer 94 can be formed by CVD, ALD, PVD or any other suitable film formation methods.

In some embodiments, the metal nitride layer 92 is a nitride layer of Ni, Ti, Ta and/or W. In certain embodiments, TiN is used as the metal nitride layer 92. In some embodiments, the metal layer 94 is a nitride layer of Ni, Ti, Ta and/or W. In certain embodiments, Ti is used as the metal layer 94. The metal element of the metal nitride layer 92 is the same as the metal layer 94 in some embodiments, and is different from the metal layer 94 in other embodiments. In some embodiments, the thickness of the metal nitride layer 94 is in a range from about 0.5 nm to about 50 nm and is in a range from about 1 nm to about 10 nm in other embodiments. When the thickness of the metal nitride layer (e.g., TiN layer) 92 is more than about 50 nm, a junction resistance Rscd increases, and when the thickness of the metal nitride layer 92 is less than 0.5 nm, the effect of nitrogen is not sufficiently obtained.

After the metal layer 94 is formed, an annealing operation is performed to from an alloy layer 95 of the metal element of the metal nitride layer 92 and/or the metal layer 94 and an element (e.g., Si or Si and Ge) of the source/drain epitaxial layer 60, and then a metal contact 100 is formed, as shown in FIG. 19.

In some embodiments, all the metal nitride (e.g., TiN) layer 92 formed on the source/drain epitaxial layer 60 is consumed to form the alloy layer 95, and a part of the metal nitride layer 92 on the ILD layer 81 remains. In other embodiments, after the alloy layer 85 is formed, a part of the metal nitride layer 92 formed on the source/drain epitaxial layer 60 remains. The remaining metal nitride layer 92 and/or the remaining metal layer 94 are removed in some embodiments, and are not removed in other embodiments.

In some embodiments, by controlling annealing conditions, an alloy layer (e.g., Ti silicide) is formed on the source/drain epitaxial layer 60 and a nitrogen containing layer is formed on the alloy layer, on which a metal layer remains.

Figure 20:
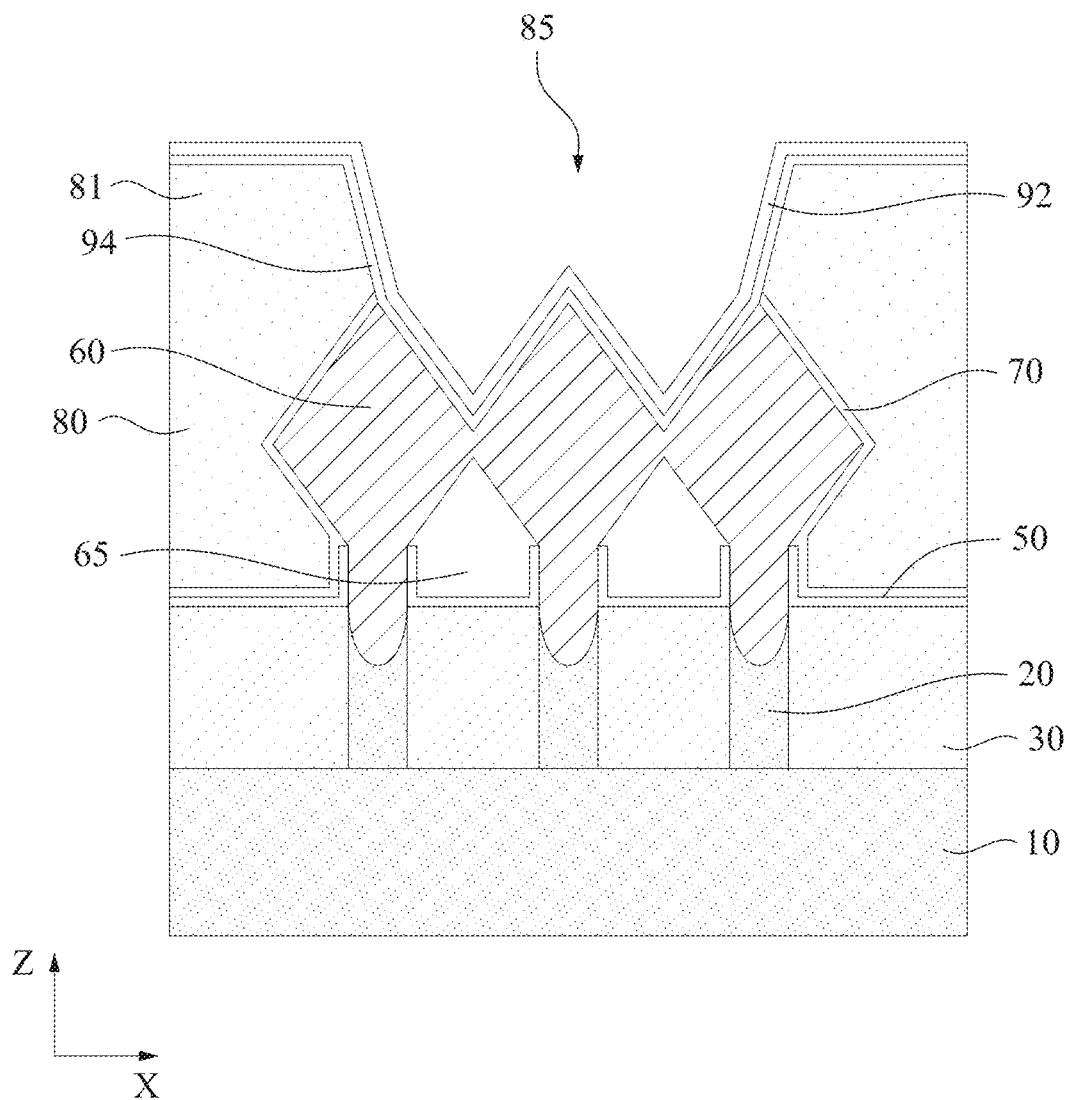
FIGS. 20 and 21 show cross sectional views of the various stages of a manufacturing operation for a semiconductor device according to an embodiment of the present disclosure.
Figure 21:
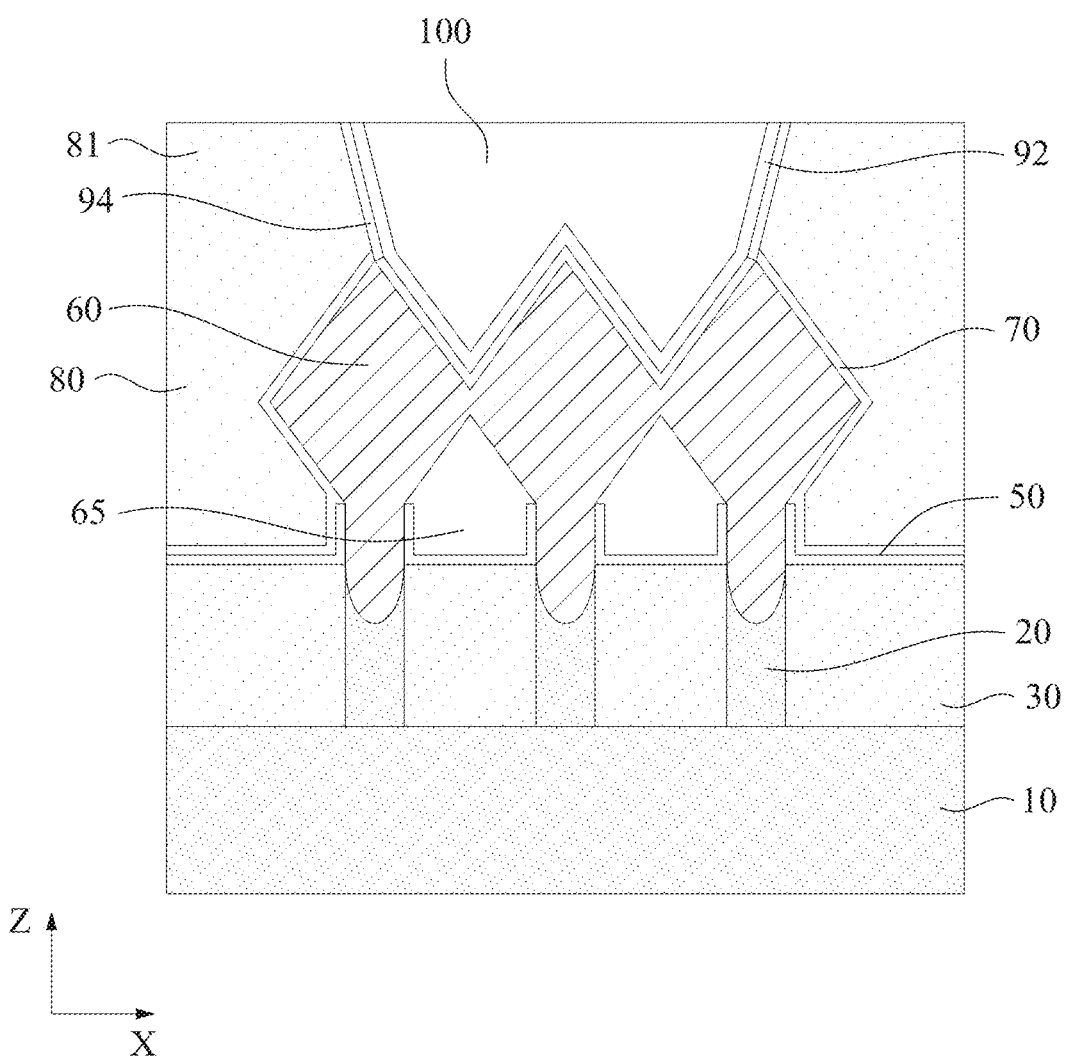

FIGS. 20 and 21 show exemplary cross sectional views of various stages for manufacturing a Fin FET device according to another embodiment of the present disclosure. Materials, configurations, dimensions, processes and/or operations same as or similar to those described with the foregoing embodiments may be employed in the following embodiments and the detailed explanation may be omitted.

After the contact opening 85 is formed as shown in FIG. 13, a metal layer 94 is formed in the contact opening 85 and a metal nitride layer 92 is formed over the metal layer 94 as shown in FIG. 20. The metal nitride layer 92 and the metal layer 94 can be formed by CVD, ALD, PVD or any other suitable film formation methods.

In some embodiments, the metal nitride layer 92 is a nitride layer of Ni, Ti, Ta and/or W. In certain embodiments, TiN is used as the metal nitride layer 92. In some embodiments, the metal layer 94 is a nitride layer of Ni, Ti, Ta and/or W. In certain embodiments, Ti is used as the metal layer 94. The metal element of the metal nitride layer 92 is the same as the metal layer 94 in some embodiments, and is different from the metal layer 94 in other embodiments. In some embodiments, the thickness of the metal nitride layer 94 is in a range from about 0.5 nm to about 50 nm and is in a range from about 1 nm to about 10 nm in other embodiments. When the thickness of the metal nitride layer (e.g., TiN layer) 92 is more than about 50 nm, a junction resistance Rscd increases, and when the thickness of the metal nitride layer 92 is less than 0.5 nm, the effect of nitrogen is not sufficiently obtained.

After the metal layer 94 is formed, an annealing operation is performed to from an alloy layer 95 of the metal element of the metal layer 94 and/or the metal nitride layer 92 and an element (e.g., Si or Si and Ge) of the source/drain epitaxial layer 60, and then a metal contact 100 is formed, as shown in FIG. 21.

In some embodiments, all the metal (e.g., Ti) layer 94 formed on the source/drain epitaxial layer 60 is consumed to form the alloy layer 95, and a part of the metal layer 94 on the ILD layer 81 remains. In other embodiments, after the alloy layer 85 is formed, a part of the metal layer 94 formed on the source/drain epitaxial layer 60 remains. The remaining metal layer 94 and/or the remaining metal nitride layer 92 are removed in some embodiments, and are not removed in other embodiments.

In some embodiments, by controlling annealing conditions, nitrogen in the metal nitride layer 92 diffuses toward the source/drain epitaxial layer 60, and a nitrogen containing layer is formed on the alloy layer, on which a metal layer formed.

In some embodiments, a metal nitride layer 92 (e.g., TiN) is formed on the source/drain epitaxial layer 60 and an annealing operation to form an alloy layer 100 is performed without forming a metal layer. By controlling annealing conditions, nitrogen in the metal nitride layer 92 diffuses toward the source/drain epitaxial layer 60, and a nitrogen containing layer is formed on the alloy layer, on which a metal layer formed.

Figure 22:
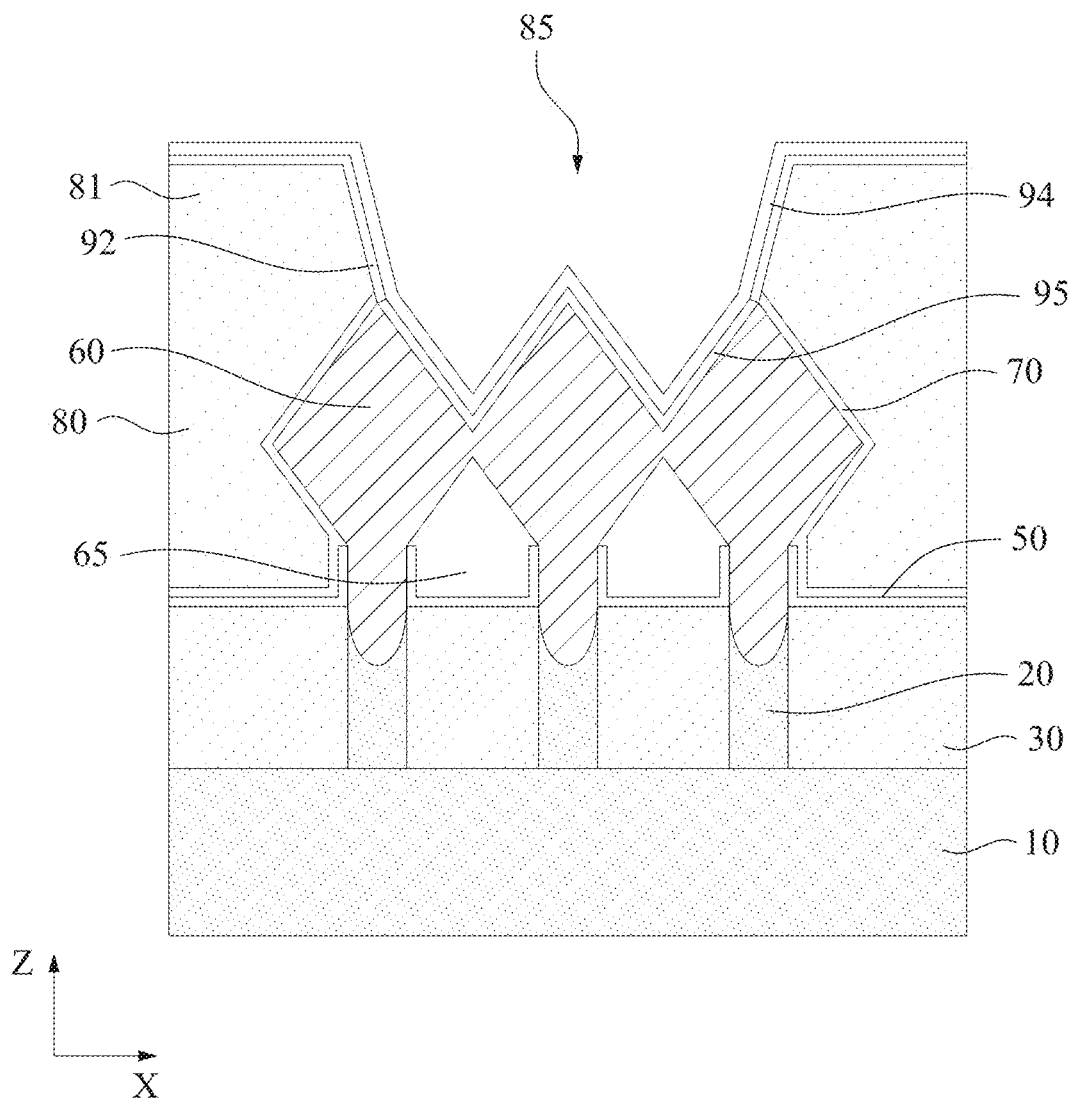
FIGS. 22 and 23 show cross sectional views of the various stages of a manufacturing operation for a semiconductor device according to an embodiment of the present disclosure.
Figure 23:
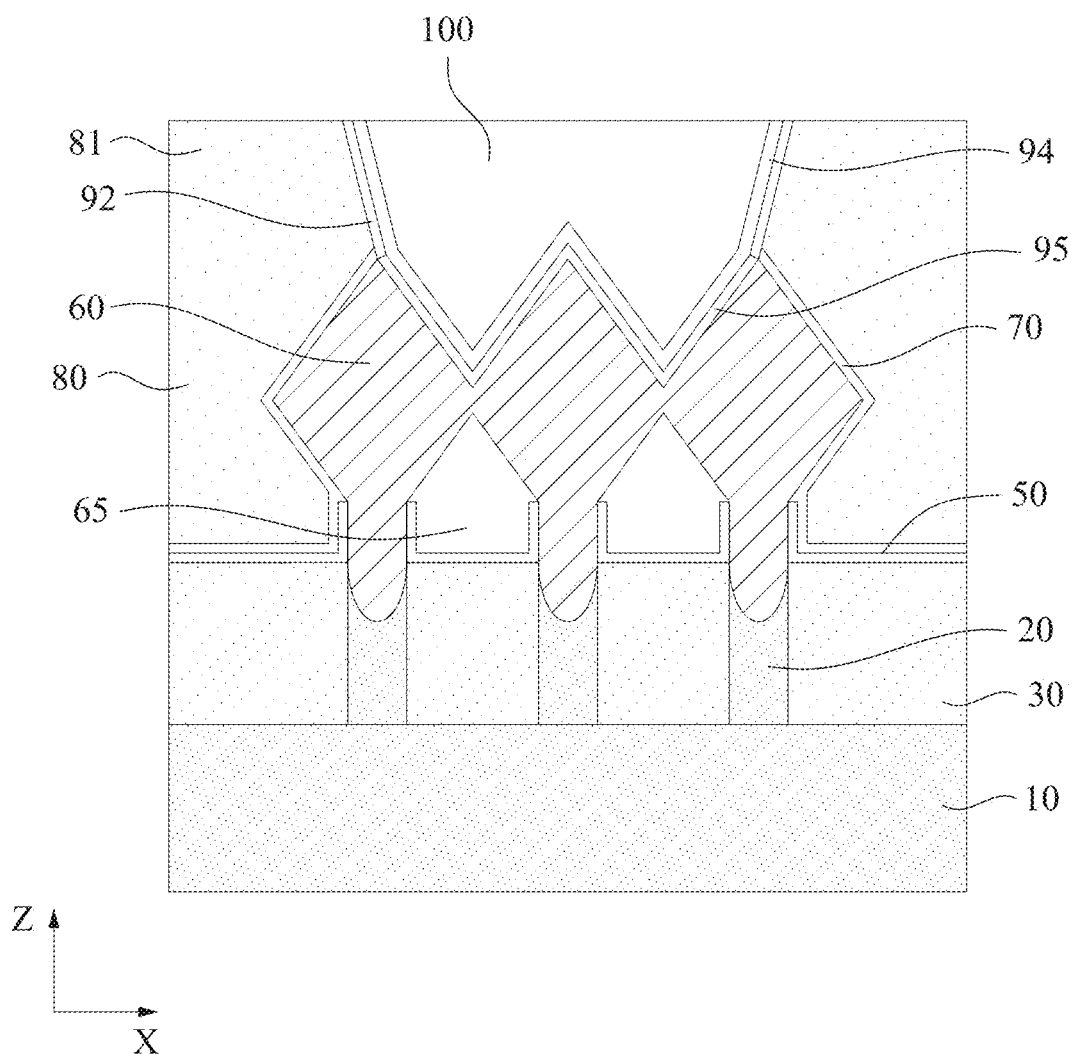

FIGS. 22 and 23 show exemplary cross sectional views of various stages for manufacturing a FinFET device according to another embodiment of the present disclosure. Materials, configurations, dimensions, processes and/or operations same as or similar to those described with the foregoing embodiments may be employed in the following embodiments and the detailed explanation may be omitted.

After the contact opening 85 is formed as shown in FIG. 13, a nitrogen containing layer 90 is formed similar to the operations explained with respect to FIG. 14. Then, a metal nitride layer 92 is formed in the contact opening 85 and a metal layer 94 is formed over the metal nitride layer 92 as shown in FIG. 22. In some embodiments, the metal nitride layer 92 is a nitride layer of Ni, Ti, Ta and/or W. In certain embodiments, TiN is used as the metal nitride layer 92. In some embodiments, the metal layer 94 is a nitride layer of Ni, Ti, Ta and/or W. In certain embodiments, Ti is used as the metal layer 94. The metal element of the metal nitride layer 92 is the same as the metal layer 94 in some embodiments, and is different from the metal layer 94 in other embodiments. In some embodiments, the thickness of the metal nitride layer 94 is in a range from about 0.5 nm to about 50 nm and is in a range from about 1 nm to about 10 nm in other embodiments. When the thickness of the metal nitride layer (e.g., TiN layer) 92 is more than about 50 nm, a junction resistance Rscd increases, and when the thickness of the metal nitride layer 92 is less than 0.5 nm, the effect of nitrogen is not sufficiently obtained.

After the metal layer 94 is formed, an annealing operation is performed to from an alloy layer 95 of the metal element of the metal nitride layer 92 and/or the metal layer 94 and an element (e.g., Si or Si and Ge) of the nitrogen containing layer 90, and then a metal contact 100 is formed, as shown in FIG. 23.

In some embodiments, all the metal nitride (e.g., TiN) layer 92 formed on the nitrogen containing layer 90 and/or the nitrogen containing layer 90 are consumed to form the alloy layer 95. A part of the metal nitride layer 92 on the ILD layer 81 remains. In other embodiments, after the alloy layer 85 is formed, a part of the metal nitride layer 92 formed on the nitrogen containing layer 90 and/or the nitrogen containing layer 90 remains. The remaining metal nitride layer 92 and/or the remaining metal layer 94 are removed in some embodiments, and are not removed in other embodiments.

In some embodiments, by controlling annealing conditions, an alloy layer (e.g., Ti silicide) is formed on the source/drain epitaxial layer 60 and a nitrogen containing layer is formed on the alloy layer, on which a metal layer remains.

FIGS. 24A-24H show cross sectional views of contact structures between the conductive contact 100 and the source/drain epitaxial layer 70 according to various embodiments of the present disclosure.

Figure 24A:
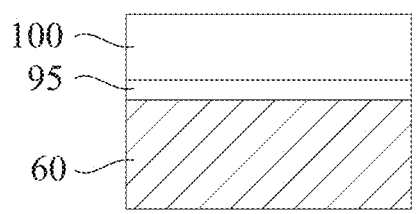
FIGS. 24A, 24B, 24C, 24D, 24E, 24F, 24G and 24H show cross sectional views of semiconductor devices according to embodiments of the present disclosure.

In FIG. 24A, an alloy layer 95, which is a silicide layer containing nitrogen, is disposed between the source/drain epitaxial layer 60 and a conductive contact 100.

Figure 24B:
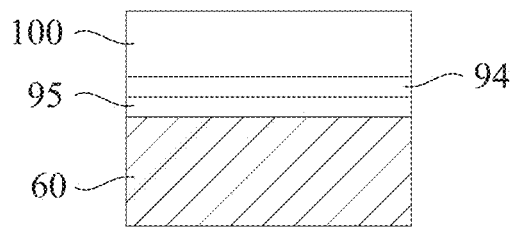

In FIG. 24B, an alloy layer 95, which is a silicide layer containing nitrogen, is disposed on the source/drain epitaxial layer 60, and a metal layer 94 remains between the alloy layer 95 and a conductive contact 100.

Figure 24C:
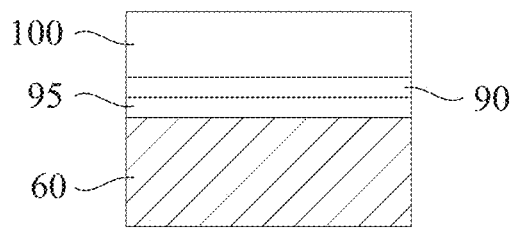

In FIG. 24C, a remaining nitrogen containing layer 90 is disposed between an alloy layer 95, which is a silicide layer containing nitrogen, and the source/drain epitaxial layer 60, and a conductive contact 100 is disposed on the alloy layer 95.

Figure 24D:
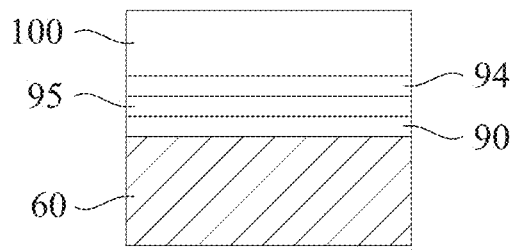

In FIG. 24D, a remaining nitrogen containing layer 90 is disposed between an alloy layer 95, which is a silicide layer containing nitrogen, and the source/drain epitaxial layer 60, and a remaining metal layer 94 is disposed between a conductive contact 100 and the alloy layer 95.

Figure 24E:
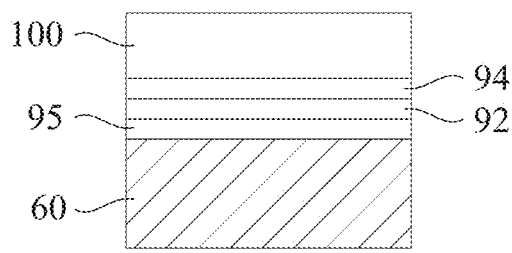

In FIG. 24E, an alloy layer 95, which is a silicide layer containing nitrogen, is disposed on the source/drain epitaxial layer 60, and a remaining metal nitride layer 92 is disposed on the alloy layer 95. Further, a remaining metal layer 94 is disposed between a conductive contact 100 and the metal nitride layer 92.

Figure 24F:
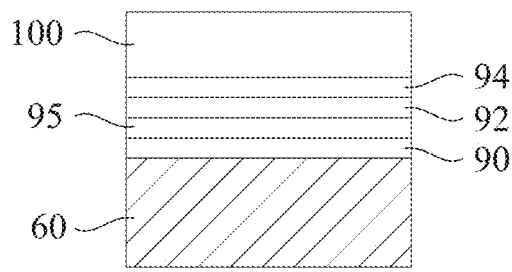

In FIG. 24F, a remaining nitrogen containing layer 90 is disposed between an alloy layer 95, which is a silicide layer containing nitrogen, and the source/drain epitaxial layer 60. A remaining metal nitride layer 92 is disposed on the alloy layer 95, and a remaining metal layer 94 is disposed between a conductive contact 100 and the metal nitride layer 92.

Figure 24G:
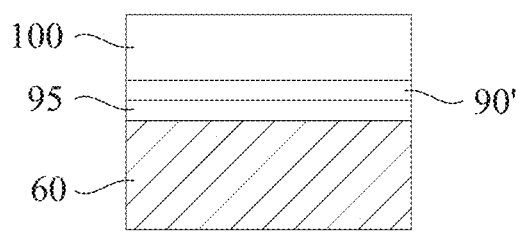

In FIG. 24G, an alloy layer 95, which is a silicide layer containing nitrogen, is disposed on the source/drain epitaxial layer 60, and a nitrogen containing layer 90 is formed between the alloy layer 95 and a conductive contact 100.

Figure 24H:
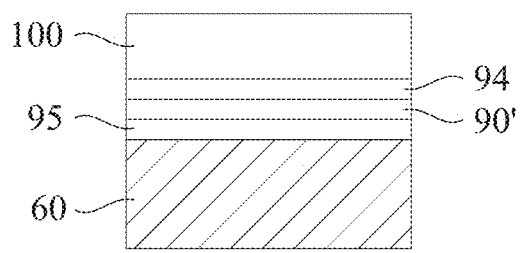

In FIG. 24H, an alloy layer 95, which is a silicide layer containing nitrogen, is disposed on the source/drain epitaxial layer 60, and a nitrogen containing layer 90 is formed between the alloy layer 95 and a remaining metal layer 94, on which a conductive contact 100 is disposed.

In the embodiments of FIGS. 24A-24H, the nitrogen containing layer includes at least 5 atomic % nitrogen. In other embodiments, the nitrogen containing layer includes at least 20 atomic % nitrogen. In some embodiments, the alloy layer 95 in one or more of FIGS. 24A-24H contains less than about 5 atomic % nitrogen.

Figure 26:
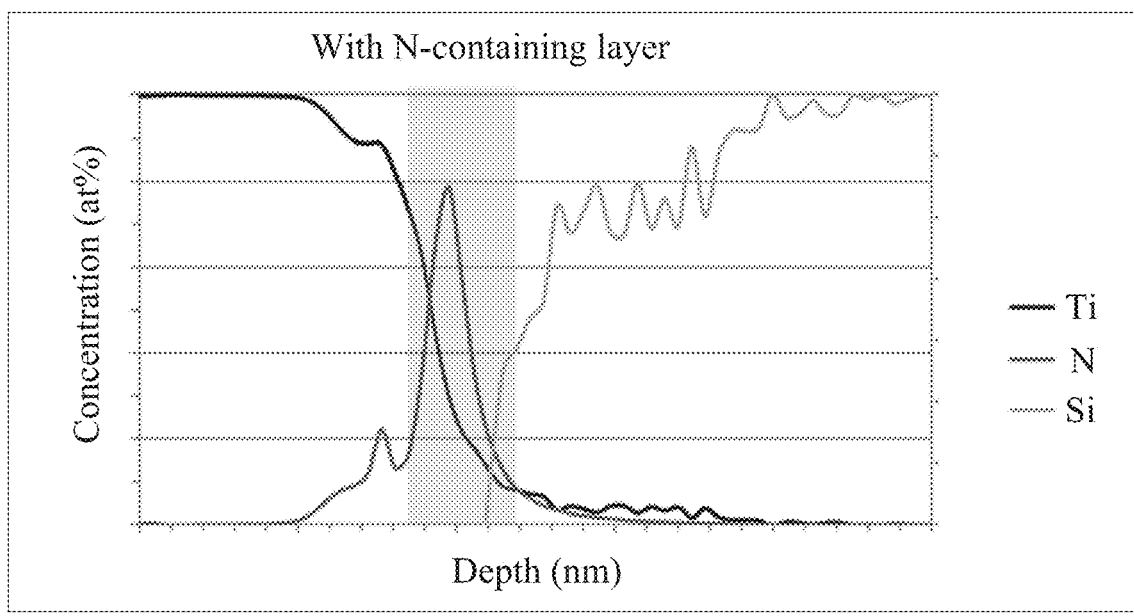
FIG. 26 shows a depth-direction element analysis result in accordance with an embodiment of the present disclosure.

FIG. 26 shows a depth-direction element analysis result in accordance with an embodiment of the present disclosure. The measurement sample was prepared according to the embodiments shown in FIGS. 18 and 19. As shown in FIG. 26, there is a nitrogen containing layer is formed between the Si layer (e.g., source/drain epitaxial layer 60) and a Ti layer (e.g., metal layer 94). A thickness of the nitrogen containing layer containing nitrogen in an amount of at least 20 atomic % is about 7 nm in FIG. 26, and it can be in a range from about 5 nm to about 10 nm. A peak nitrogen amount in the nitrogen containing layer is about 80 atomic % in FIG. 26, and it can be in a range from 50 atomic % to 95 atomic %.

Figure 27:
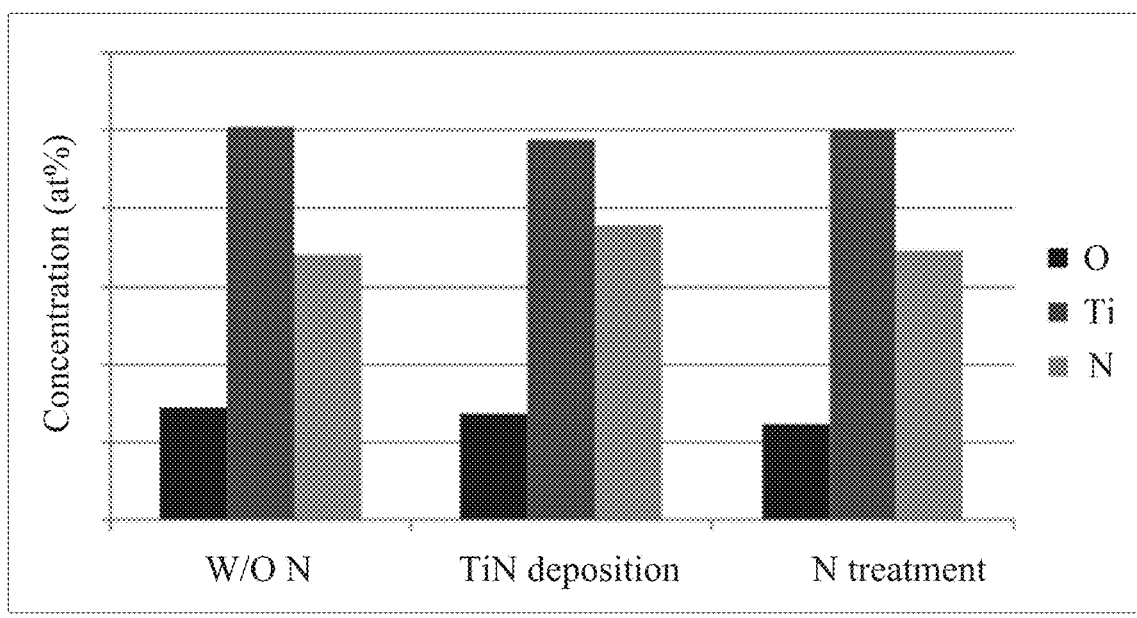
FIG. 27 shows comparison of element analysis results in accordance with an embodiment of the present disclosure.

FIG. 27 shows comparison of element analysis results in accordance with an embodiment of the present disclosure. The samples were a structure having no nitrogen containing layer, a structure containing a nitrogen containing layer by TiN layer deposition, and a structure containing a nitrogen containing layer by nitrogen treatment. The amounts of the elements are measured at a center of the silicide layer. By forming a nitrogen containing layer, oxygen amount decreases to less than about 13.5 atomic %. A smaller oxygen amount can also improve contact resistance.

Figure 28:
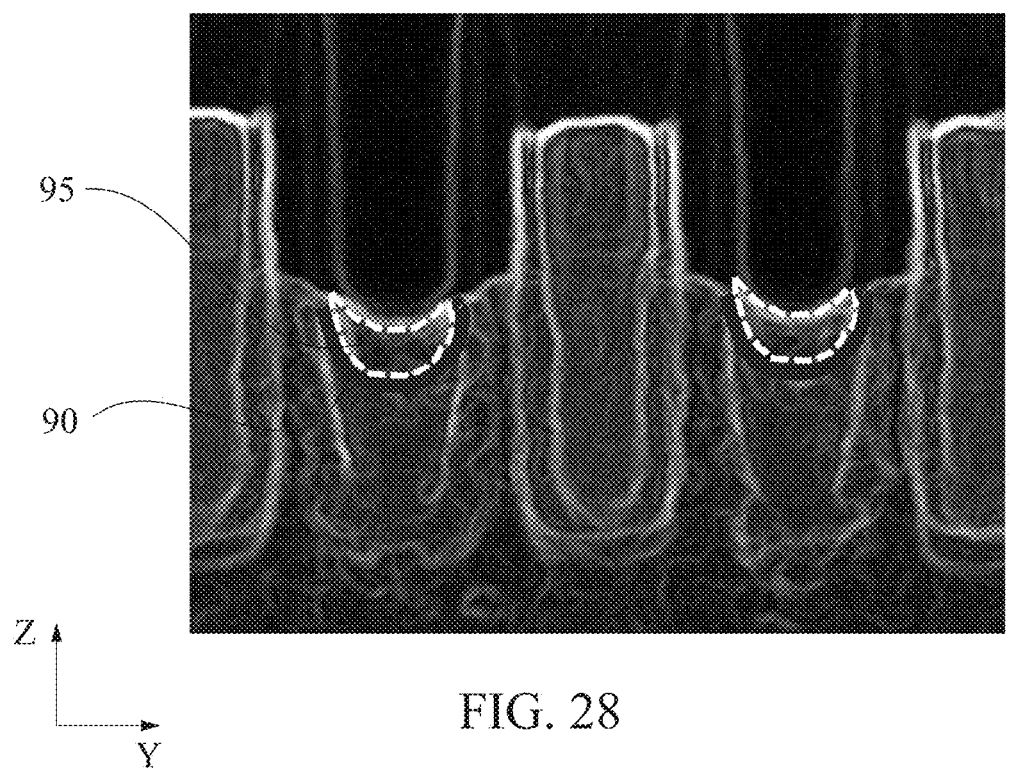
FIGS. 28 and 29 show cross sectional view of a semiconductor device in accordance with an embodiment of the present disclosure.
Figure 29:
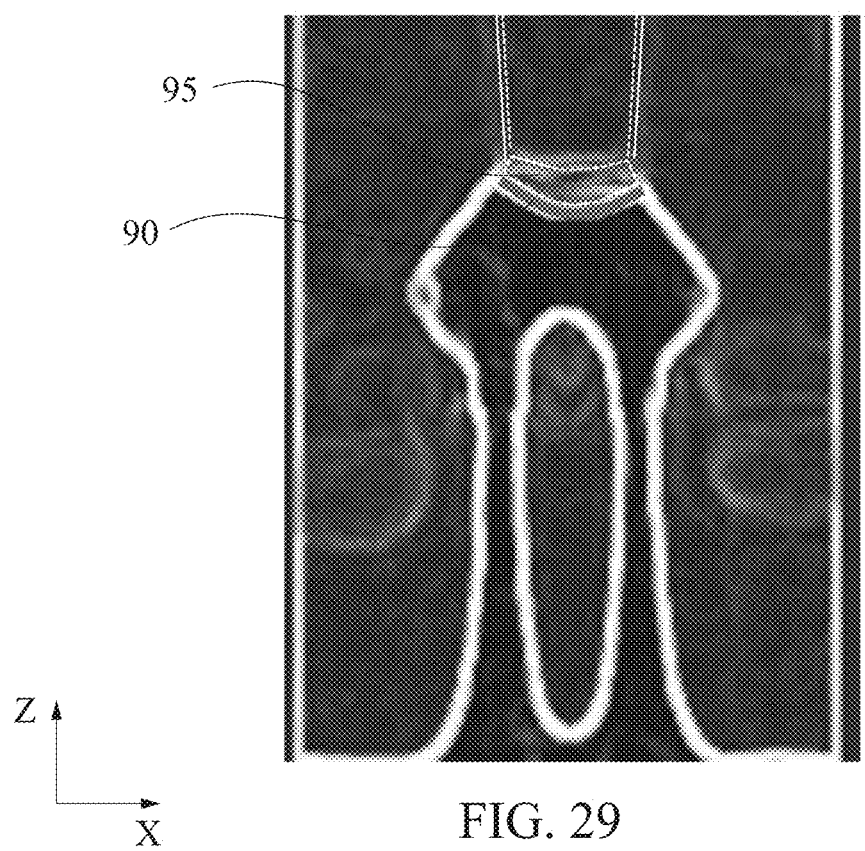
Figure 30:
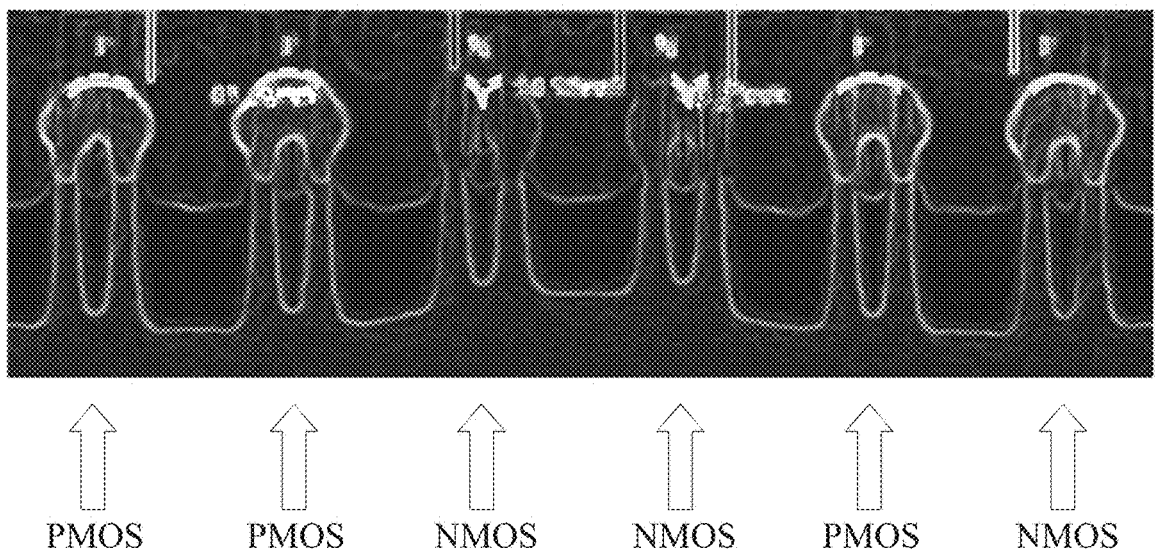
FIGS. 30 and 31 show cross sectional view of a semiconductor device in accordance with an embodiment of the present disclosure.
Figure 31:
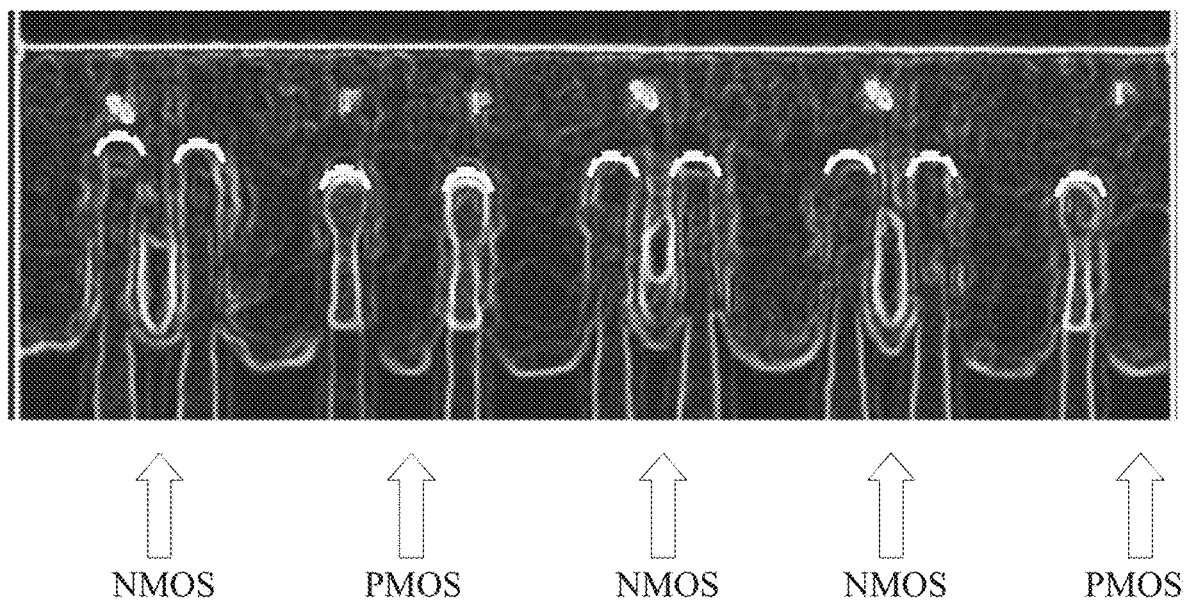

FIGS. 28 and 29 show cross sectional view of a semiconductor device in accordance with an embodiment of the present disclosure. The nitrogen containing layer 90 has a convex curved shape toward the substrate in some embodiments. FIG. 30 shows a cross sectional view of a ring oscillator of a semiconductor device and FIG. 31 shows a cross sectional view of a static random access memory of a semiconductor device in accordance with an embodiment of the present disclosure. The nitrogen containing layer has a convex curved shape toward the substrate in some embodiments.

It will be understood that not all advantages have been necessarily discussed herein, no particular advantage is required for all embodiments or examples, and other embodiments or examples may offer different advantages.

According to embodiments of the present disclosure, one or more nitrogen containing layer containing nitrogen at least, for example 5 atomic %, are disposed between a source/drain epitaxial layer and a conductive metal contact. The nitrogen containing layer can reduce a Schottky barrier height between the source/drain epitaxial layer and the conductive metal contact, and thus can reduce contact resistance Rscd in the source/drain regions.

In accordance with one aspect of the present disclosure, in a method of manufacturing a semiconductor device, an epitaxial source/drain structure is formed at a source/drain region disposed over a substrate, a nitrogen containing layer is formed on or in a surface of the epitaxial source/drain structure, a metallic layer is formed over the nitrogen containing layer, and an alloy layer of an element of the epitaxial source/drain structure is formed over a source/drain region and an element of the metallic layer. In one or more of the foregoing and following embodiments, the nitrogen containing layer is formed by exposing the surface of the epitaxial source/drain structure to plasma formed from a nitrogen containing gas. In one or more of the foregoing and following embodiments, the nitrogen containing layer is formed by exposing the surface of the epitaxial source/drain structure to an $NH_3$ gas while heating the substrate. In one or more of the foregoing and following embodiments, the substrate is heated at a temperature 475° C. or higher. In one or more of the foregoing and following embodiments, the nitrogen containing layer is a TiN layer. In one or more of the foregoing and following embodiments, the metallic layer includes a Ti layer. In one or more of the foregoing and following embodiments, the nitrogen containing layer contains nitrogen in an amount of at least 20 atomic %. In one or more of the foregoing and following embodiments, a thickness of the nitrogen containing layer containing nitrogen in an amount of at least 20 atomic % is in a range from 5 nm to 10 nm. In one or more of the foregoing and following embodiments, a peak nitrogen amount in the nitrogen containing layer is in a range from 50 atomic % to 95 atomic %. In one or more of the foregoing and following embodiments, after the nitrogen containing layer is formed, an annealing operation is performed at a temperature 475° C. or higher.

In accordance with another aspect of the present disclosure, in a method of manufacturing a semiconductor device, an epitaxial source/drain structure is formed at a source/drain region disposed over a substrate, a first implantation operation is performed to introduce first ions into the epitaxial source/drain structure, a second implantation operation is performed to introduce second ions different from the first ions into the epitaxial source/drain structure, a first annealing operation is performed, a nitrogen containing layer is formed on or in a surface of the epitaxial source/drain structure, a metallic layer is formed over the nitrogen containing layer, and an alloy layer of an element of the epitaxial source/drain structure is formed over a source/drain region and an element of the metallic layer. In one or more of the foregoing and following embodiments, the epitaxial source/drain structure includes SiGe. In one or more of the foregoing and following embodiments, the first ions are Ge ions. In one or more of the foregoing and following embodiments, the second ions include boron. In one or more of the foregoing and following embodiments, the first annealing operation includes laser annealing. In one or more of the foregoing and following embodiments, after the nitrogen containing layer is formed, performing a second annealing operation at a temperature 475° C. or higher.

According to another aspect of the present disclosure, in a method of manufacturing a semiconductor device, an epitaxial source/drain structure is formed at a source/drain region disposed over a substrate, an interlayer dielectric (ILD) layer is formed over the epitaxial source/drain structure, a contact opening is formed in the ILD layer to expose a part of an upper surface of the epitaxial source/drain structure, a nitrogen containing layer is formed on or in the upper surface of the epitaxial source/drain structure, a metallic layer is formed over the nitrogen containing layer, an alloy layer of an element of the epitaxial source/drain structure is formed over a source/drain region and an element of the metallic layer, and a conducive layer is formed over the alloy layer in the contact opening. In one or more of the foregoing and following embodiments, the nitrogen containing layer is formed by exposing the surface of the epitaxial source/drain structure to plasma formed from a nitrogen containing gas. In one or more of the foregoing and following embodiments, the nitrogen containing layer is formed by exposing the surface of the epitaxial source/drain structure to an $NH_3$ gas while heating the substrate. In one or more of the foregoing and following embodiments, after the nitrogen containing layer is formed, an annealing operation is performed at a temperature 475° C. or higher.

In accordance with one aspect of the present disclosure, a semiconductor device includes a gate structure disposed over a channel region, a source/drain epitaxial layer disposed at a source/drain region, a nitrogen containing layer disposed on the source/drain epitaxial layer, a silicide layer disposed on the nitrogen containing layer, and a conductive contact disposed on the silicide layer. In one or more of the foregoing and following embodiments, the nitrogen containing layer contains nitrogen in an amount of at least 20 atomic %. In one or more of the foregoing and following embodiments, a thickness of the nitrogen containing layer containing nitrogen in an amount of at least 20 atomic % is in a range from 5 nm to 10 nm. In one or more of the foregoing and following embodiments, a peak nitrogen amount in the nitrogen containing layer is in a range from 50 atomic % to 95 atomic %. In one or more of the foregoing and following embodiments, the silicide layer includes TiSi. In one or more of the foregoing and following embodiments, the source/drain epitaxial layer includes SiGe, and the silicide layer includes TiSi containing Ge. In one or more of the foregoing and following embodiments, the nitrogen containing layer comprises Si—N bonds. In one or more of the foregoing and following embodiments, the nitrogen containing layer is a TiN layer. In one or more of the foregoing and following embodiments, the nitrogen containing layer is other than a TiN layer. In one or more of the foregoing and following embodiments, the semiconductor device further includes a TiN layer between the nitrogen containing layer and the silicide layer.

In accordance with another aspect of the present disclosure, a semiconductor device includes a gate structure disposed over a channel region, a source/drain epitaxial layer disposed at a source/drain region, a silicide layer disposed on the source/drain epitaxial layer, a nitrogen containing layer disposed on the silicide layer, and a conductive contact disposed on the nitrogen containing layer. In one or more of the foregoing and following embodiments, the nitrogen containing layer contains nitrogen in an amount of at least 20 atomic %. In one or more of the foregoing and following embodiments, a thickness of the nitrogen containing layer containing nitrogen in an amount of at least 20 atomic % is in a range from 5 nm to 10 nm. In one or more of the foregoing and following embodiments, a peak nitrogen amount in the nitrogen containing layer is in a range from 50 atomic % to 95 atomic %. In one or more of the foregoing and following embodiments, the silicide layer includes TiSi. In one or more of the foregoing and following embodiments, the source/drain epitaxial layer includes SiGe, and the silicide layer includes TiSi containing Ge.

In accordance with another aspect of the present disclosure, a semiconductor device includes an isolation insulating layer disposed over a substrate, a plurality of fin structures disposed over the substrate and extending in a first direction in plan view, a gate structure disposed over parts of the plurality of fin structures, and extending in a second direction crossing the first direction, a source/drain epitaxial layer, a dielectric layer disposed on an upper surface of the isolation insulating layer, a silicide layer disposed on the source/drain epitaxial layer, and a conductive contact disposed on the silicide layer. The silicide layer includes a metal element, silicon and nitrogen. In one or more of the foregoing and following embodiments, the metal element is Ti. In one or more of the foregoing and following embodiments, the silicide layer contains nitrogen in an amount of at least 20 atomic %. In one or more of the foregoing and following embodiments, a peak nitrogen amount in the silicide layer is in a range from 50 atomic % to 95 atomic %.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    forming a source/drain epitaxial layer at a source/drain region disposed over a substrate;
    forming a nitrogen containing layer on or in a surface of the source/drain epitaxial layer by exposing the surface of the source/drain epitaxial layer to plasma formed from a nitrogen containing gas that is a mixed gas of $N_2$ and Ar or to an $NH_3$ gas while heating the substrate at a temperature between 475° C. to 550° C.;
    forming a metal layer over the nitrogen containing layer; and
    forming an alloy layer of an element of the source/drain epitaxial layer over the source/drain region and an element of the metal layer,
    wherein after the nitrogen containing layer is formed, an annealing operation at a temperature 475° C. or higher is performed.

2. The method of claim 1, wherein the nitrogen containing layer is formed by exposing the surface of the source/drain epitaxial layer to the $NH_3$ gas.

3. The method of claim 1, wherein the metal layer is a Ni layer, a W layer or a Ta layer.

4. The method of claim 1, wherein the metal layer is a Ti layer.

5. The method of claim 1, wherein the nitrogen containing layer contains nitrogen in an amount of at least 20 atomic %.

6. The method of claim 5, wherein a thickness of the nitrogen containing layer containing nitrogen in an amount of at least 20 atomic % is in a range from 5 nm to 10 nm.

7. The method of claim 1, wherein a peak nitrogen amount in the nitrogen containing layer is in a range from 50 atomic % to 95 atomic %.

8. The method of claim 1, wherein the metal layer is a W layer.

9. The method of claim 1, wherein the nitrogen containing layer is formed by exposing the surface of the source/drain epitaxial layer to the $NH_3$.

10. A method of manufacturing a semiconductor device, the method comprising:
    forming a source/drain epitaxial layer at a source/drain region disposed over a substrate;
    performing a first implantation operation to introduce first ions into the source/drain epitaxial layer;
    performing a second implantation operation to introduce second ions different from the first ions into the source/drain epitaxial layer;
    performing a first annealing operation;
    forming a nitrogen containing layer on or in a surface of the source/drain epitaxial layer by exposing the surface of the source/drain epitaxial layer to plasma formed from a nitrogen containing gas that is mixed gas of $N_2$ and Ar, or to an NH₃ gas while heating the substrate at a temperature between 475° C. to 550° C.;

forming a metallic layer over the nitrogen containing layer; and forming an alloy layer of an element of the source/drain epitaxial layer over the source/drain region and an element of the metallic layer, wherein after the nitrogen containing layer is formed, an annealing operation at a temperature 475° C. or higher is performed.

11. The method of claim 10, wherein the source/drain epitaxial layer includes SiGe.

12. The method of claim 11, wherein the first ions are Ge ions.

13. The method of claim 11, wherein the second ions include boron.

14. The method of claim 10, wherein the first annealing operation includes laser annealing.

15. The method of claim 10, wherein the metallic layer is a Ni layer or a W layer.

16. The method of claim 10, wherein the nitrogen containing layer is formed by exposing the surface of the source/drain epitaxial layer to the NH₃.

17. A method of manufacturing a semiconductor device, the method comprising:

forming a source/drain epitaxial layer at a source/drain region disposed over a substrate;

forming an interlayer dielectric (ILD) layer over the source/drain epitaxial layer;

forming a contact opening in the ILD layer to expose a part of an upper surface the source/drain epitaxial layer;

forming a nitrogen containing layer on or in the upper surface of the source/drain epitaxial layer by exposing the surface of the source/drain epitaxial layer to plasma formed from mixed gas of N₂ and Ar or to an NH₃ gas while heating the substrate at a temperature between 475° C. to 550° C.;

forming a metallic layer over the nitrogen containing layer;

forming an alloy layer of an element of the source/drain epitaxial layer over the source/drain region and an element of the metallic layer; and forming a conducive layer over the alloy layer in the contact opening, wherein after the nitrogen containing layer is formed, an annealing operation at a temperature 475° C. or higher is performed.

18. The method of claim 17, wherein the nitrogen containing layer is formed by exposing the surface of the source/drain epitaxial layer to the NH₃ gas.

19. The method of claim 17, wherein the metal layer is a Ni layer.

* * * * *